(12) United States Patent
Uchida

(10) Patent No.: US 11,717,912 B2
(45) Date of Patent: Aug. 8, 2023

(54) CAPILLARY GUIDE DEVICE AND WIRE BONDING APPARATUS

(71) Applicant: SHINKAWA LTD., Tokyo (JP)

(72) Inventor: Yohei Uchida, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 217 days.

(21) Appl. No.: 17/431,718

(22) PCT Filed: Mar. 16, 2020

(86) PCT No.: PCT/JP2020/011535
§ 371 (c)(1),
(2) Date: Aug. 18, 2021

(87) PCT Pub. No.: WO2020/189642
PCT Pub. Date: Sep. 24, 2020

(65) Prior Publication Data
US 2022/0134468 A1 May 5, 2022

(30) Foreign Application Priority Data
Mar. 18, 2019 (JP) ................................ 2019-049856

(51) Int. Cl.
*B23K 20/00* (2006.01)
*B23K 20/10* (2006.01)
(Continued)

(52) U.S. Cl.
CPC ............ *B23K 20/005* (2013.01); *B23K 20/10* (2013.01); *B23K 20/26* (2013.01); *H01L 24/78* (2013.01);
(Continued)

(58) Field of Classification Search
CPC ...... B23K 20/005; B23K 20/10; B23K 20/26; B23K 2101/40; B23K 2101/42;
(Continued)

(56) References Cited

U.S. PATENT DOCUMENTS 8,672,270 B2   3/2014  Vas
2012/0132695 A1* 5/2012  Zhang .................. B23K 20/005
228/44.3

(Continued)

FOREIGN PATENT DOCUMENTS

CN   102013406 A * 4/2011 ........... B23K 20/007
CN   110734295 A * 1/2020 ........... C04B 37/023
(Continued)

OTHER PUBLICATIONS

"Office Action of Taiwan Counterpart Application", dated Nov. 25, 2020, with English translation thereof, pp. 1-8.
(Continued)

*Primary Examiner* — Kiley S Stoner
(74) *Attorney, Agent, or Firm* — JCIPRNET

(57) ABSTRACT

A capillary guide device (40) includes: a guide body portion (41) capable of being in contact with a capillary (8) held in a hole (7h); and a drive portion (42) which arranges the guide body portion (41) at a position capable of being in contact with the capillary (8) by moving the guide body portion (41) along an X-axis direction. The drive portion (42) includes: a table (46) connected to the guide body portion (41); a drive shaft (47b) extending in the X-axis direction and exhibiting a frictional resistance force with the table (46); and an ultrasonic element (47a) fixed to an end of the drive shaft (47b) and supplying an ultrasonic wave to the drive shaft (47b).

5 Claims, 20 Drawing Sheets

(51) Int. Cl.
  *B23K 20/26* (2006.01)
  *H01L 23/00* (2006.01)
  *B23K 101/40* (2006.01)
  *B23K 101/42* (2006.01)

(52) U.S. Cl.
  CPC ...... *B23K 2101/40* (2018.08); *B23K 2101/42* (2018.08); *H01L 2224/789* (2013.01); *H01L 2224/78301* (2013.01); *H01L 2224/78349* (2013.01)

(58) Field of Classification Search
  CPC .............. B23K 37/0241; B23K 20/106; B23K 20/004–007; H01L 24/78; H01L 2224/78301; H01L 2224/78349; H01L 2224/789; H01L 2224/78308; H01L 2224/78353; H01L 2224/78901; H01L 2924/00014; H01L 24/45; H01L 24/85; B06B 1/10
  USPC ........................................ 228/4.5, 180.5, 904
  See application file for complete search history.

(56) References Cited

U.S. PATENT DOCUMENTS

| | | |
|---|---|---|
| 2013/0221071 A1 | 8/2013 | Kim et al. |
| 2017/0229419 A1* | 8/2017 | Hashim .................. H01L 24/78 |
| 2017/0256654 A1 | 9/2017 | Yamazaki et al. |
| 2018/0315732 A1 | 11/2018 | Takemoto |
| 2020/0091107 A1 | 3/2020 | Takemoto |
| 2020/0185538 A1 | 6/2020 | Yamazaki et al. |

FOREIGN PATENT DOCUMENTS

| | | | | |
|---|---|---|---|---|
| JP | H09213732 A | * | 8/1997 | |
| JP | 2007173355 | | 7/2007 | |
| JP | 2008141025 | | 6/2008 | |
| JP | 2008288473 A | * | 11/2008 | ............. H01L 24/78 |
| JP | 2016127174 A | * | 7/2016 | |
| JP | 2017112260 | | 6/2017 | |
| JP | 2018006731 | | 1/2018 | |
| WO | WO-2013069857 A1 | * | 5/2013 | ............. H01L 24/78 |
| WO | WO-2014021141 A1 | * | 2/2014 | ........... B23K 20/106 |
| WO | WO-2014103463 A1 | * | 7/2014 | ........... B23K 20/007 |
| WO | WO-2020105434 A1 | * | 5/2020 | ............. B23K 20/10 |
| WO | WO-2020189642 A1 | * | 9/2020 | ............... B06B 1/10 |

OTHER PUBLICATIONS

"International Search Report (Form PCT/ISA/210) of PCT/JP2020/011535," dated May 26, 2020, with English translation thereof, pp. 1-4.

* cited by examiner

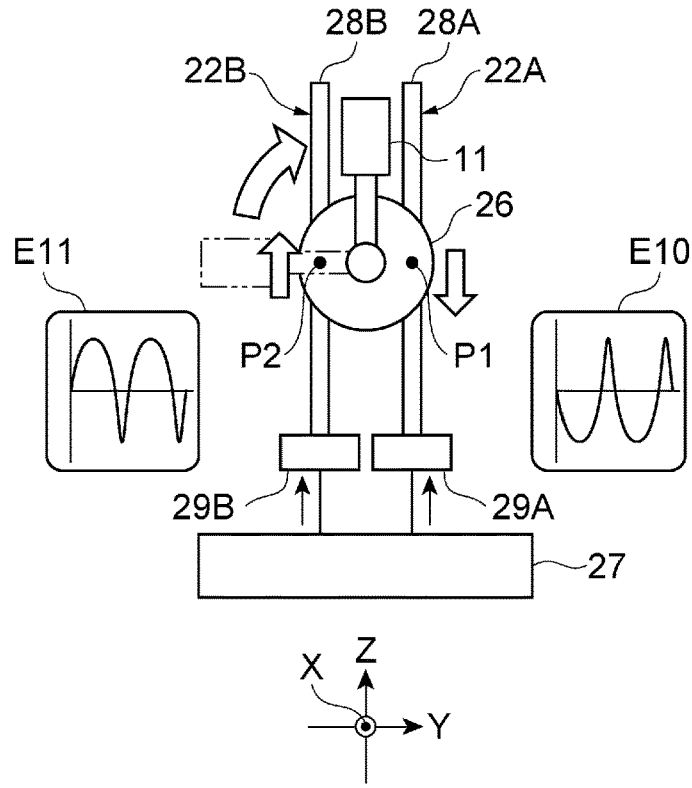
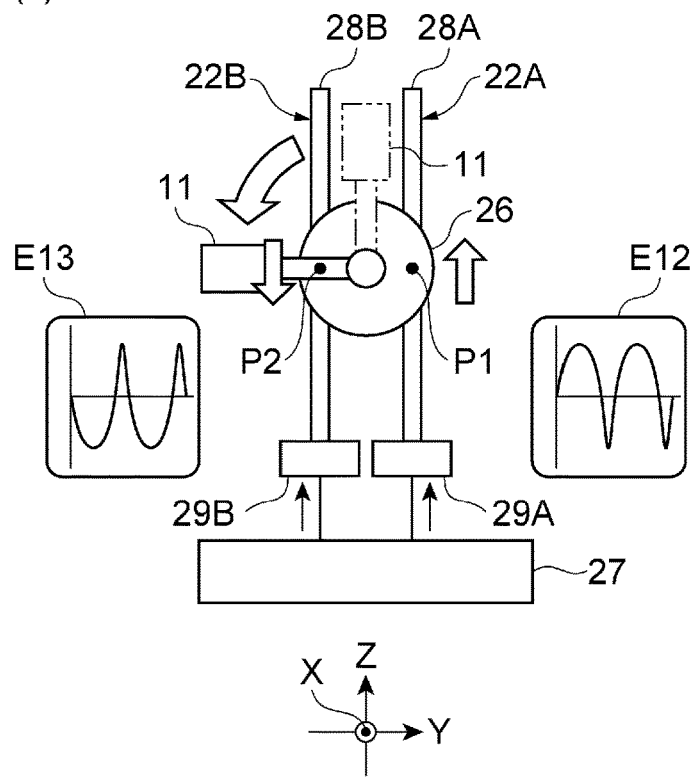
FIG. 8

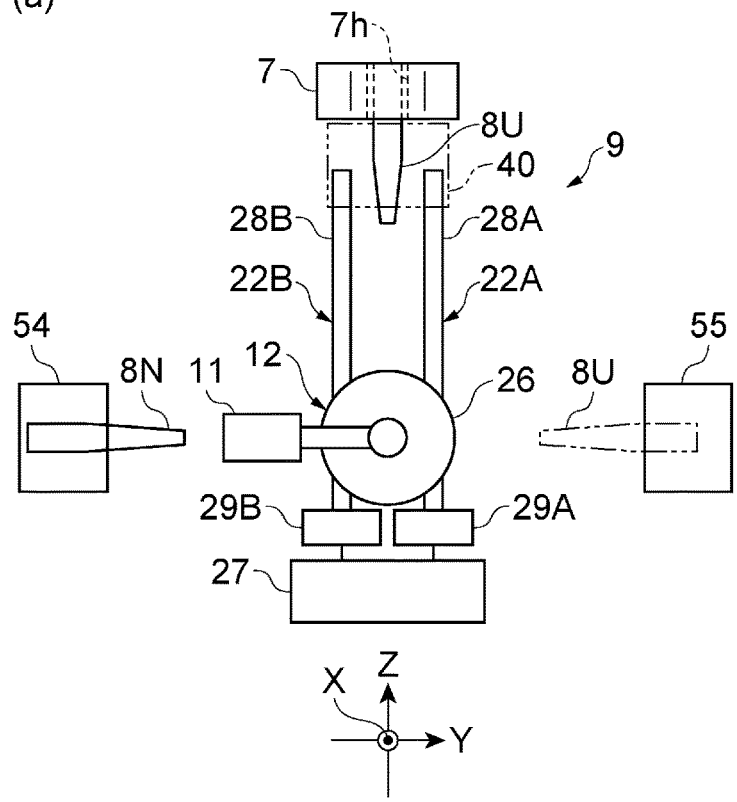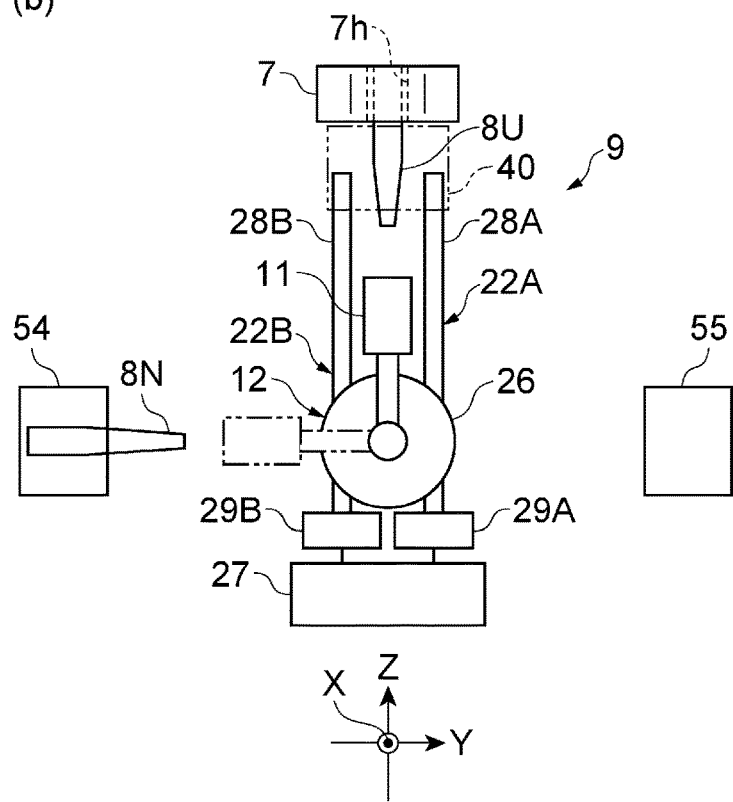
FIG. 11

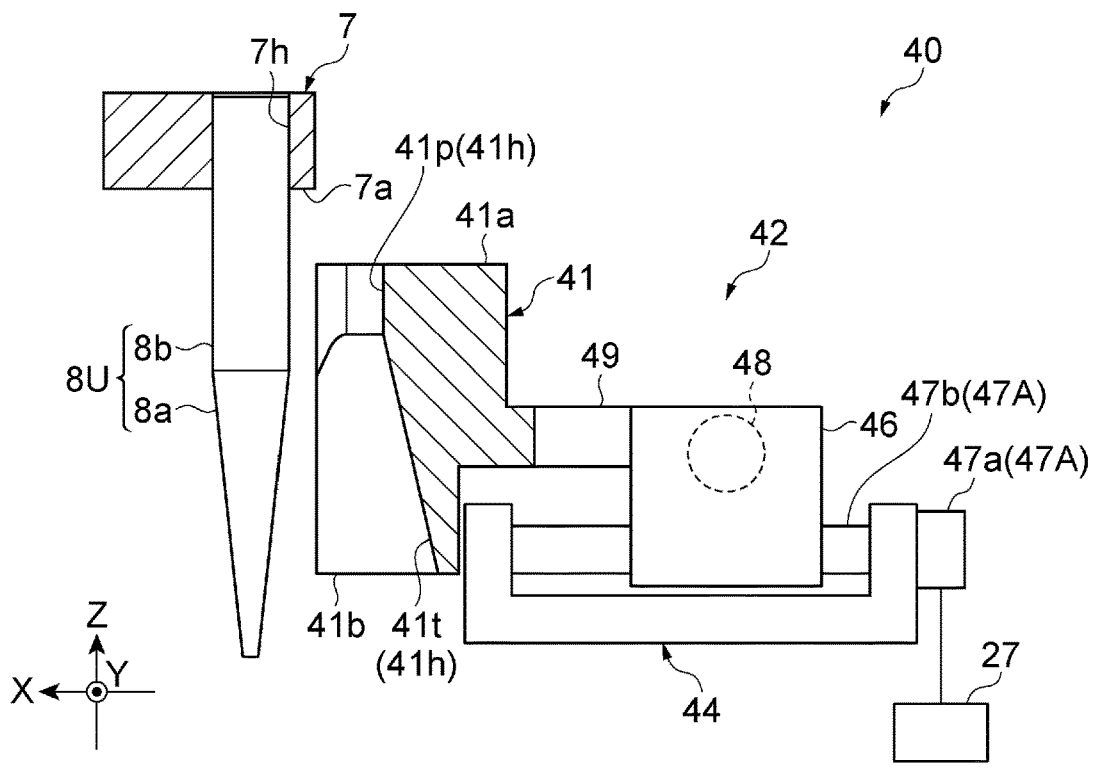
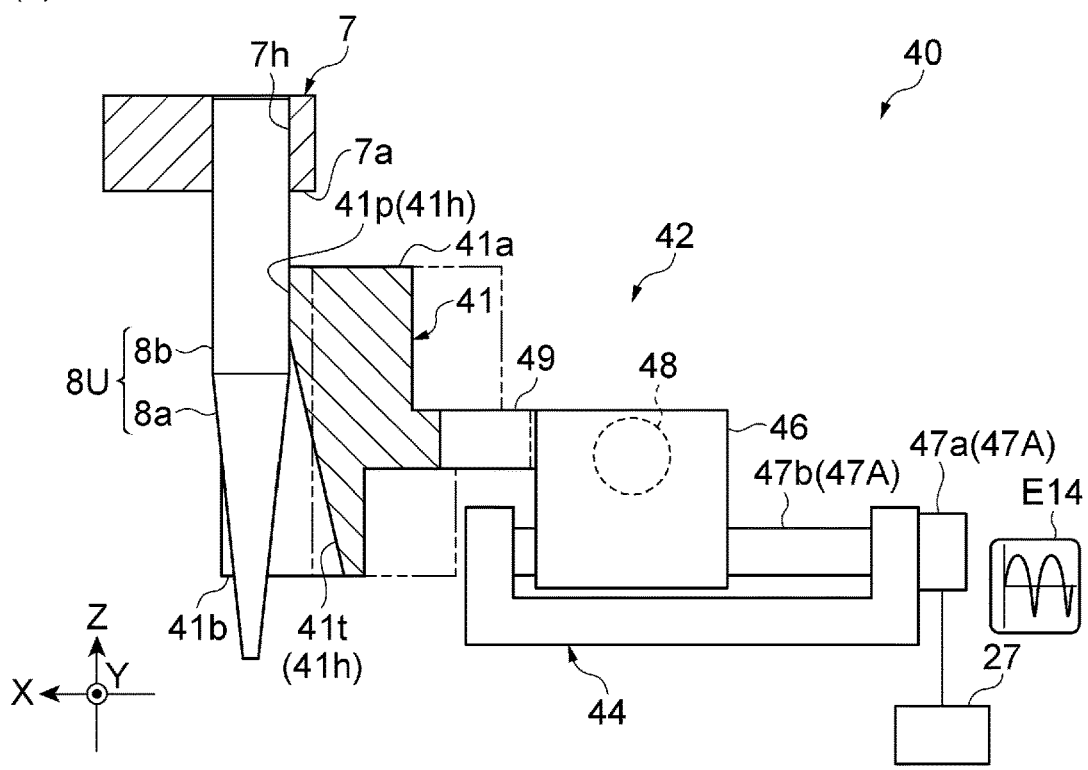
FIG. 12

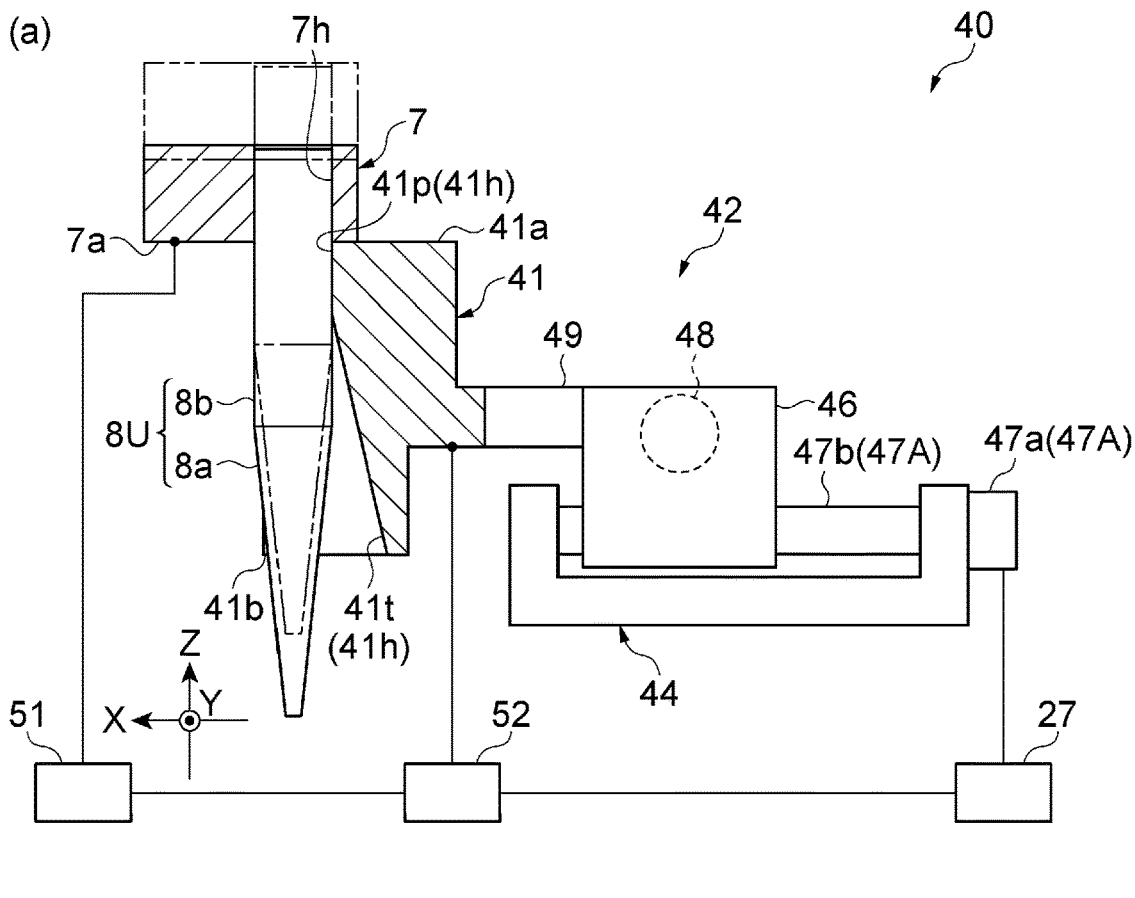
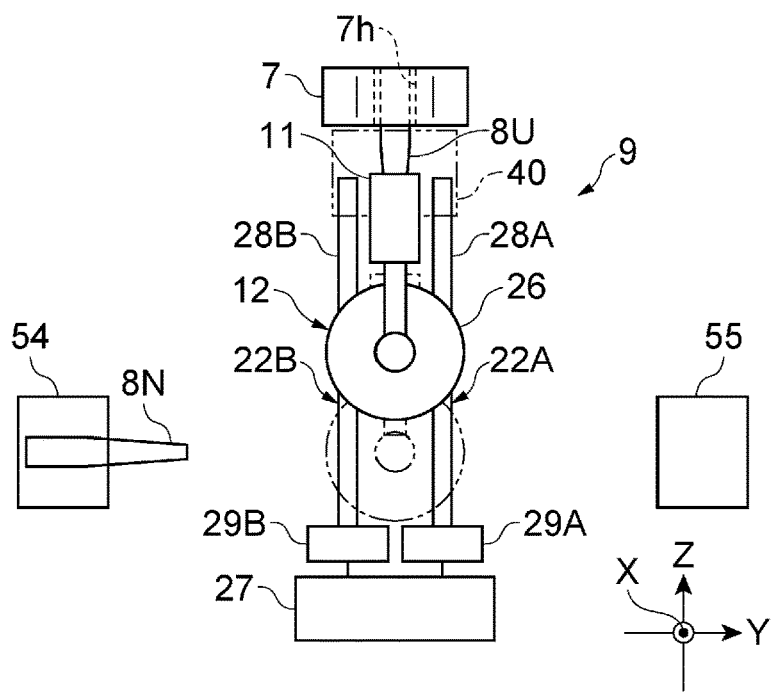
FIG. 13

(a)
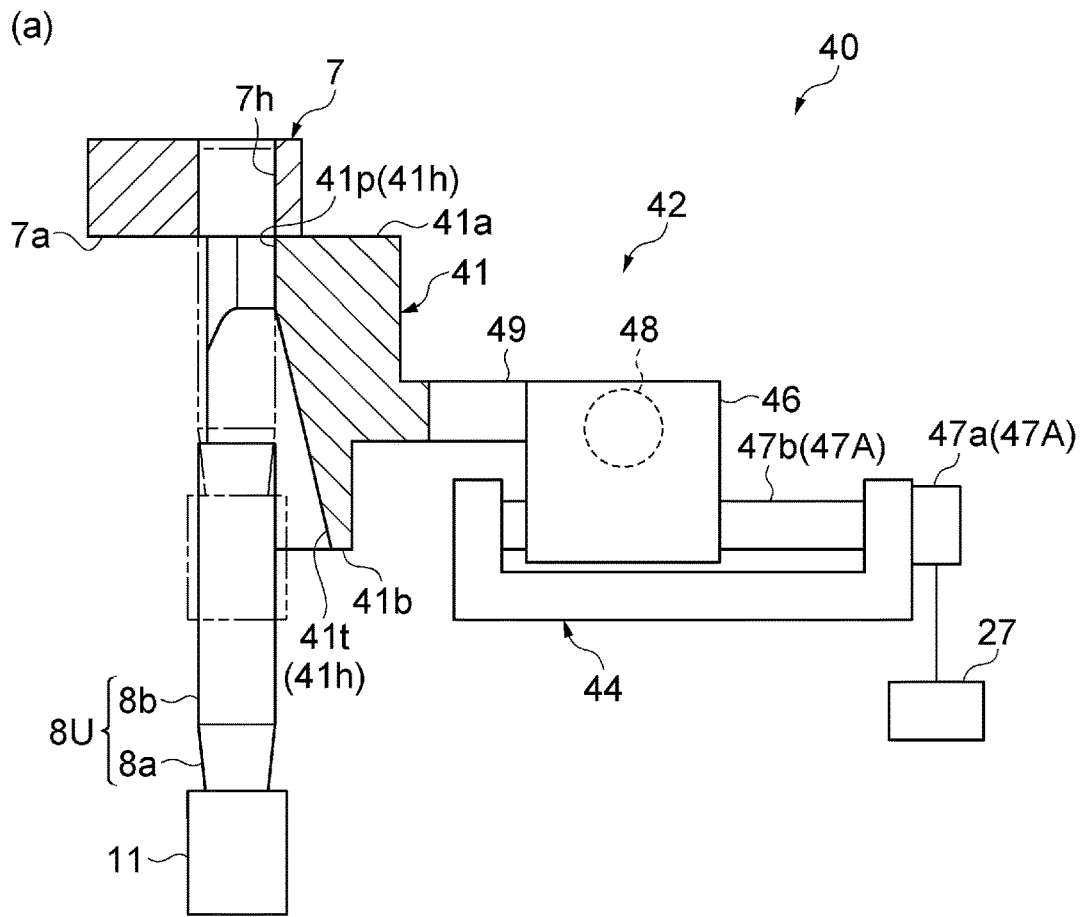
(b)
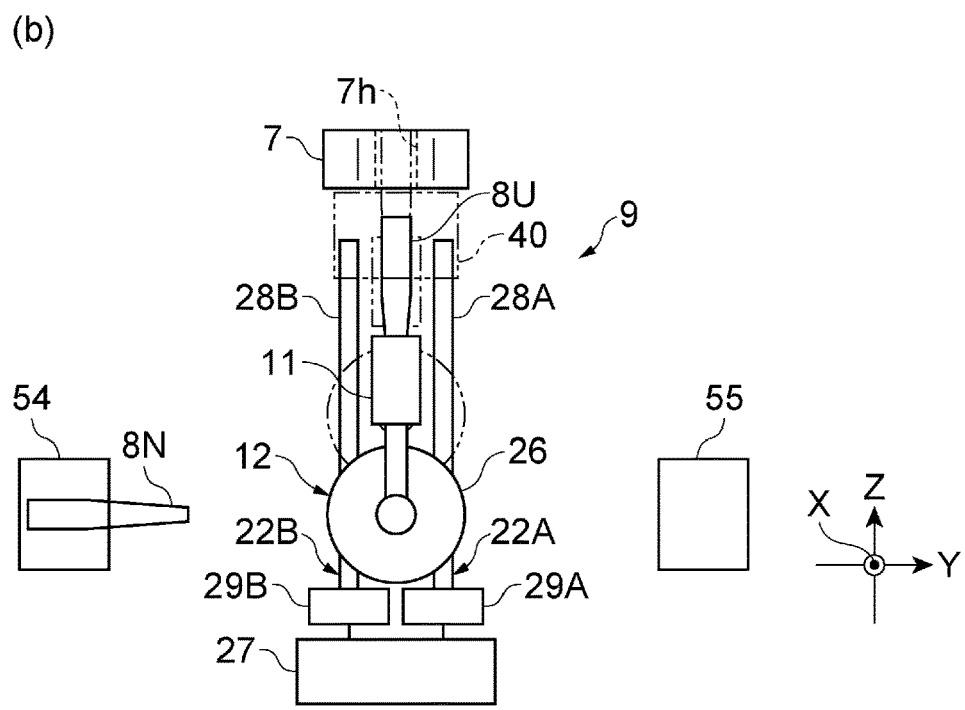
FIG. 14

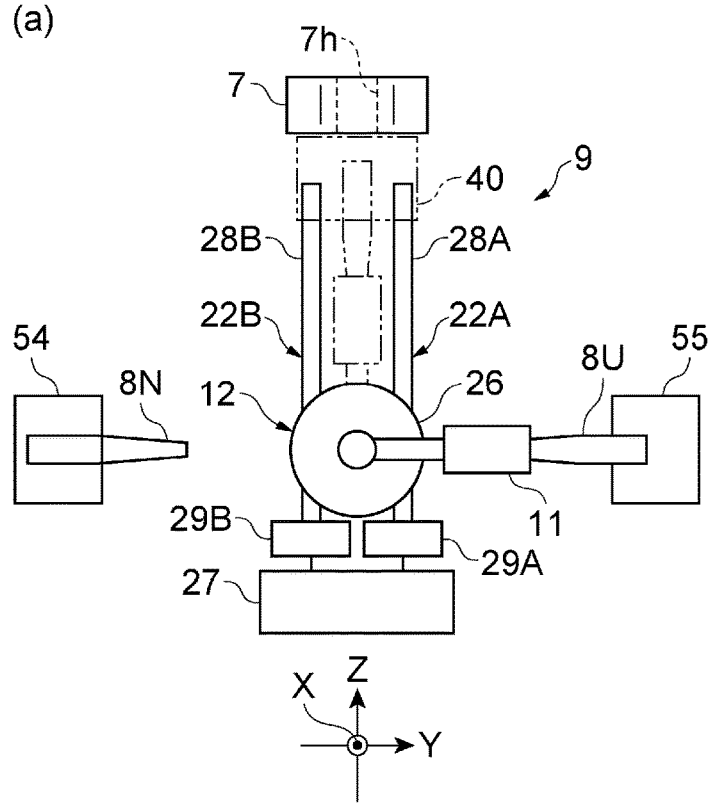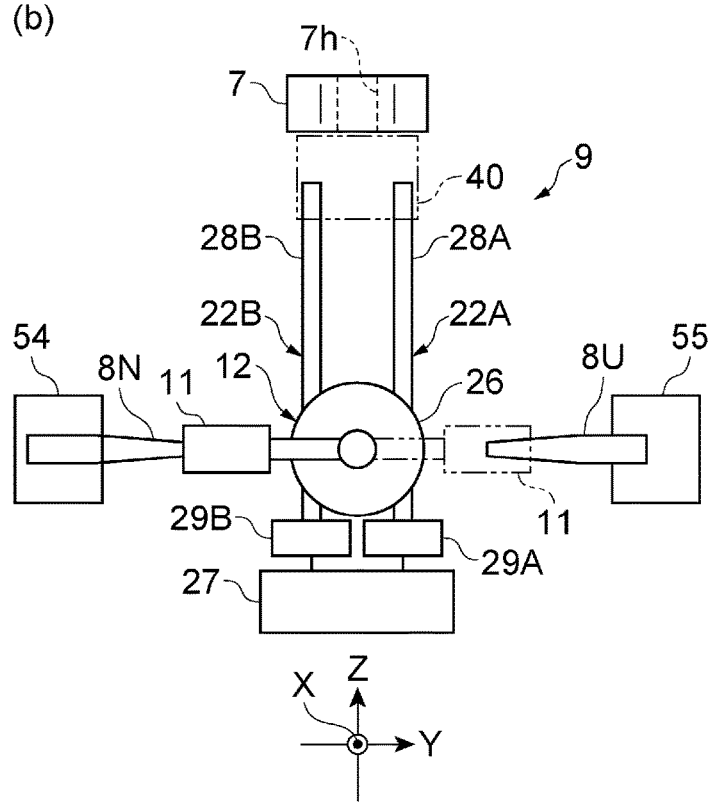
FIG. 15

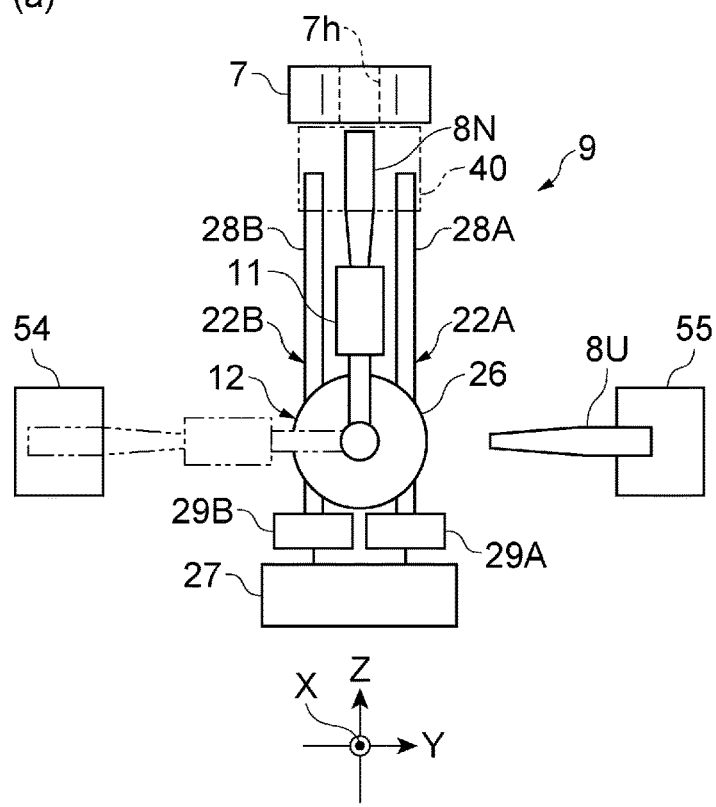
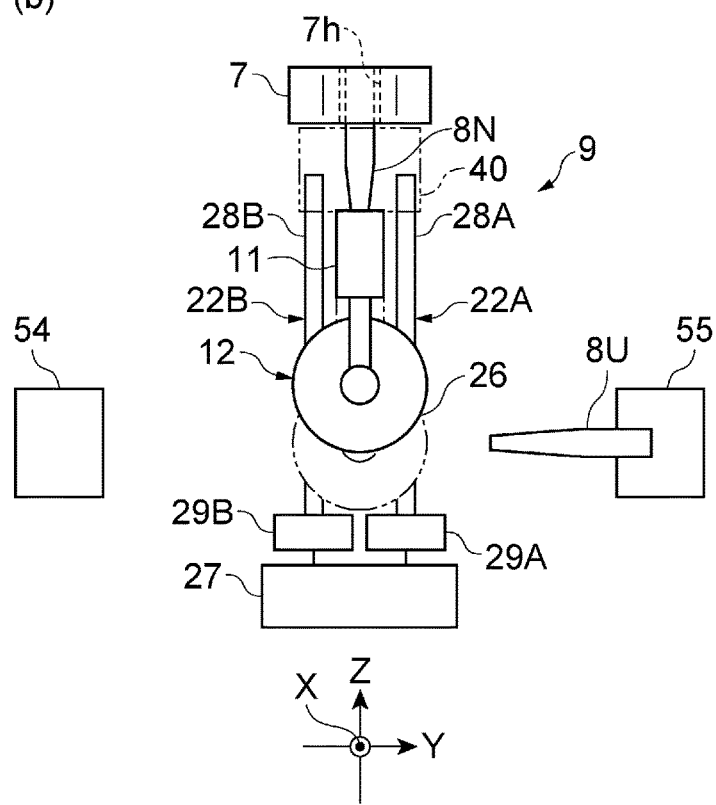
FIG. 16

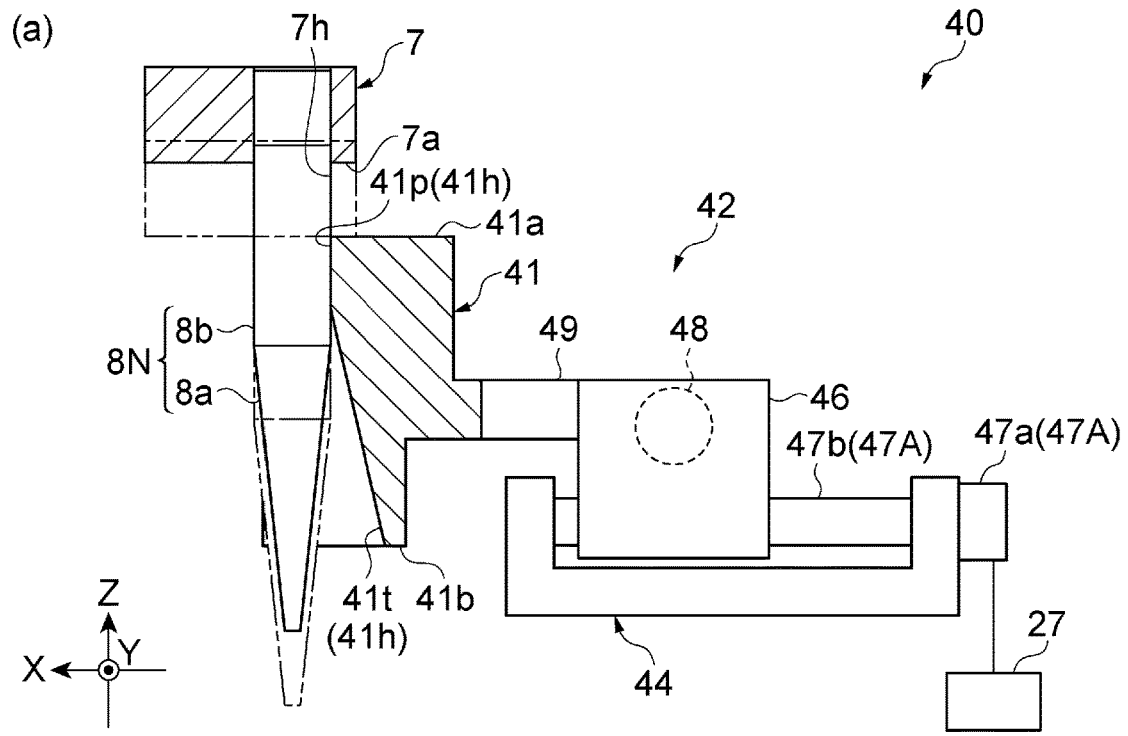
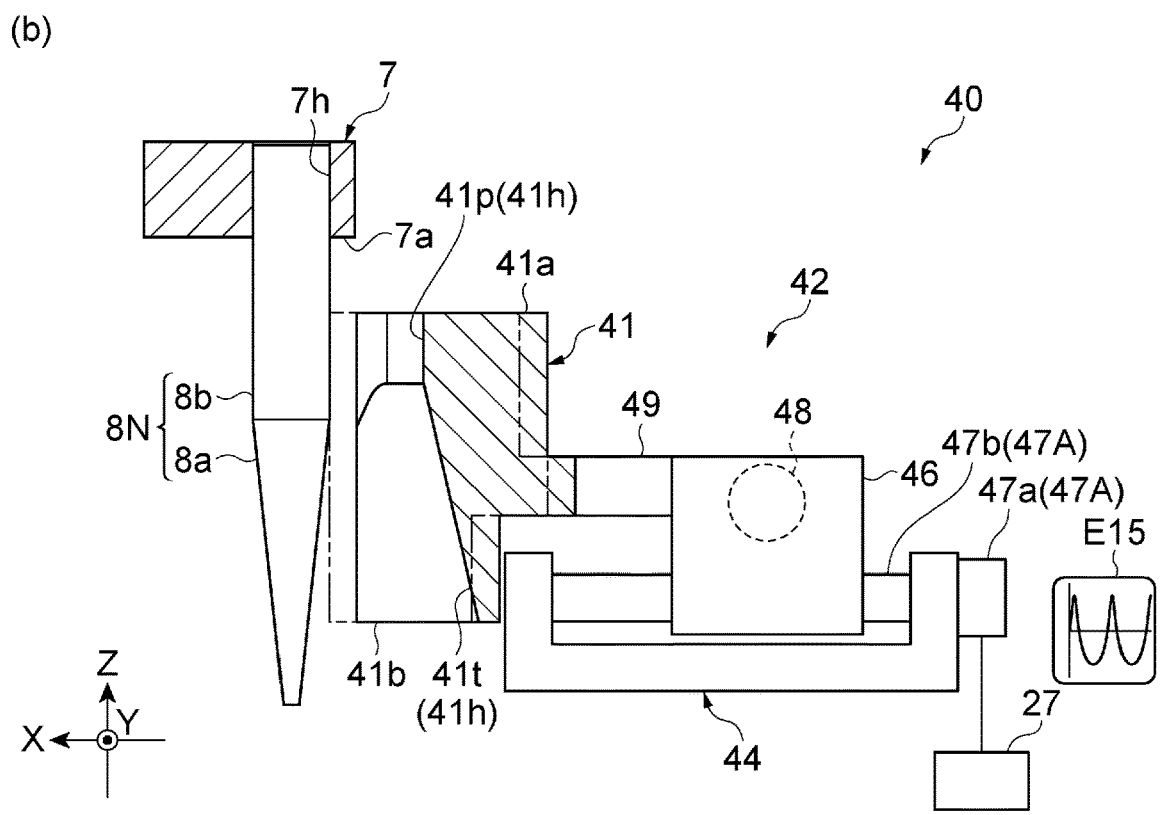
FIG. 19

CAPILLARY GUIDE DEVICE AND WIRE BONDING APPARATUS

CROSS-REFERENCE TO RELATED APPLICATION

This application is a 371 application of the International PCT application serial no. PCT/JP2020/011535, filed on Mar. 16, 2020, which claims the priority benefits of Japan Patent Application No. 2019-049856, filed on Mar. 18, 2019. The entirety of each of the above-mentioned patent applications is hereby incorporated by reference herein and made a part of this specification.

BACKGROUND

Technical Field

The present invention relates to a capillary guide device and a wire bonding apparatus.

Related Art

Patent literature 1 discloses a wire bonding apparatus. The wire bonding apparatus has a capillary which is a bonding tool. The wire bonding apparatus connects a wire to an electrode by using the capillary to apply heat, an ultrasonic wave, or the like to the wire.

LITERATURE OF RELATED ART

Patent Literature

Patent literature 1: Japanese Patent Laid-open No. 2018-6731

SUMMARY

Problems to be Solved

In a manufacturing factory of electronic machines, plural manufacturing apparatuses are operated in order to manufacture a large number of electronic machines. As the number of manufacturing apparatus increases, the number of production increases. On the other hand, the manufacturing apparatus requires various maintenance works. The maintenance works are required for each manufacturing apparatus. Thus, the increase in the number of the production and the load of maintenance works are in a contradictory relationship. Therefore, if the maintenance works can be automatically performed without the worker, the load of the maintenance works can be reduced.

The wire bonding apparatus has a capillary replacement work as one of the maintenance works. Therefore, in this technical field, a technique capable of reliably performing an automatic capillary replacement work is desired.

An object of the present invention is to provide a capillary guide device and a wire bonding apparatus that can reliably perform an automatic capillary replacement work.

Means to Solve Problems

One embodiment of the present invention is a capillary guide device which guides a capillary into a holding hole of a bonding tool. The capillary guide device includes: a guide body portion capable of being in contact with the capillary held in the holding hole; and a drive portion which arranges the guide body portion at a position capable of being in contact with the capillary by moving the guide body portion along a second direction intersecting a first direction along a central axis of the holding hole. The drive portion includes: a moving body connected to the guide body portion; a drive shaft extending in the second direction and exerting a frictional resistance force with the moving body; and an ultrasonic wave generation body fixed to an end of the drive shaft and supplying an ultrasonic wave to the drive shaft.

The guide body portion may be in contact the capillary held by the bonding tool. With this contact, the position of the capillary held by the bonding tool may be preserved as the position of the guide body portion. Here, when the guide body portion is brought into contact with the capillary, the drive portion brings the guide body portion closer to the capillary by moving the moving body by an ultrasonic wave supplied by the ultrasonic wave generation body. Then, the position of the guide body portion in contact with the capillary is held by the frictional resistance force between the moving body and the drive shaft. That is, in the state when the guide body portion is in contact with the capillary, there is no force with which the guide body portion presses the capillary. As a result, the relative position of the guide body portion with respect to the bonding tool is reliably maintained when the capillary is detached. That is, when the capillary is guided by the guide body portion, the capillary can be reliably guided to the holding hole of the bonding tool. Thus, an automatic replacement work of the capillary can be reliably performed.

The drive portion of the capillary guide device may further include a vibration generation portion which is attached to the moving body and which supplies a vibration along a third direction intersecting each of the first direction and the second direction to the guide body portion via the moving body. According to this configuration, the guide body portion can be reliably brought into contact with the capillary. Thus, the position of the capillary can be more satisfactorily stored as the position of the guide body portion.

The guide body portion of the capillary guide device may include a guide surface capable of being in contact with a side surface of the capillary; and a tapered surface continuous with the guide surface. A main surface of the guide body portion facing the bonding tool may include an open end that constitutes the guide surface. A back surface of the guide body portion opposite to the main surface may include an open end that constitutes the tapered surface. According to these configurations, a new capillary is supplied from the tapered surface side. As a result, even when an outer peripheral surface of the capillary is deviated from the guide surface, the capillary is guided to the guide surface by moving along the tapered surface continuous with the guide surface. Thus, the automatic replacement work of the capillary can be further reliably performed.

The capillary guide device may further include a contact detection portion which detects that the guide body portion comes into contact with the bonding tool. The contact detection portion may further include a voltage supply portion which generates a potential difference between the bonding tool and the guide body portion; and an information acquisition portion which acquires information indicating that the guide body portion comes into contact with the bonding tool according to a state of an electric circuit formed by the bonding tool, the guide body portion, and the voltage supply portion. According to these configurations, the contact between the bonding tool and the guide body portion may be electrically detected. Thus, a reaction force acting between the bonding tool and the guide body portion can be made extremely small. Then, the relative position of the guide body portion with respect to the bonding tool can be maintained more reliably.

A wire bonding apparatus according to another embodiment of the present invention includes: a bonding tool having a capillary detachably held in a holding hole; and a mounting portion that guides the capillary to the holding hole by a guide portion and attaches the capillary to the holding hole. The guide portion includes: a guide body portion capable of being in contact with the capillary held in the holding hole; and a drive portion which arranges the guide body portion at a position capable of being in contact with the capillary by moving the guide body portion along a second direction intersecting a first direction along a central axis of the holding hole. The drive portion includes: a moving body connected to the guide body portion; a drive shaft extending in the second direction and exerting a frictional resistance force with the moving body; and an ultrasonic wave generation body fixed to an end of the drive shaft and supplying an ultrasonic wave to the drive shaft. The wire bonding apparatus includes the guide portion having the same configuration as that of the capillary guide device. Thus, the wire bonding apparatus can reliably perform the automatic replacement work of the capillary.

Effect

According to the present invention, a capillary guide device and a wire bonding apparatus are provided which can reliably perform an automatic replacement work of a capillary.

BRIEF DESCRIPTION OF THE DRAWINGS

FIG. 8 is a diagram illustrating specific control of the actuator.

FIG. 11 is a diagram showing an operation of the capillary replacement device.

FIG. 12 is a diagram showing an operation of the capillary replacement device subsequent to FIG. 11.

FIG. 13 is a diagram showing an operation of the capillary replacement device subsequent to FIG. 12.

FIG. 14 is a diagram showing an operation of the capillary replacement device subsequent to FIG. 13.

FIG. 15 is a diagram showing an operation of the capillary replacement device subsequent to FIG. 14.

FIG. 16 is a diagram showing an operation of the capillary replacement device subsequent to FIG. 15.

FIG. 19 is a diagram showing an operation of the capillary replacement device subsequent to FIG. 16.

DESCRIPTION OF THE EMBODIMENTS

Embodiments for implementing the present invention are described specifically below with reference to the accompanying drawings. In the description of the drawings, the same elements are denoted by the same reference symbols, and repeated description is omitted.

Figure 1:
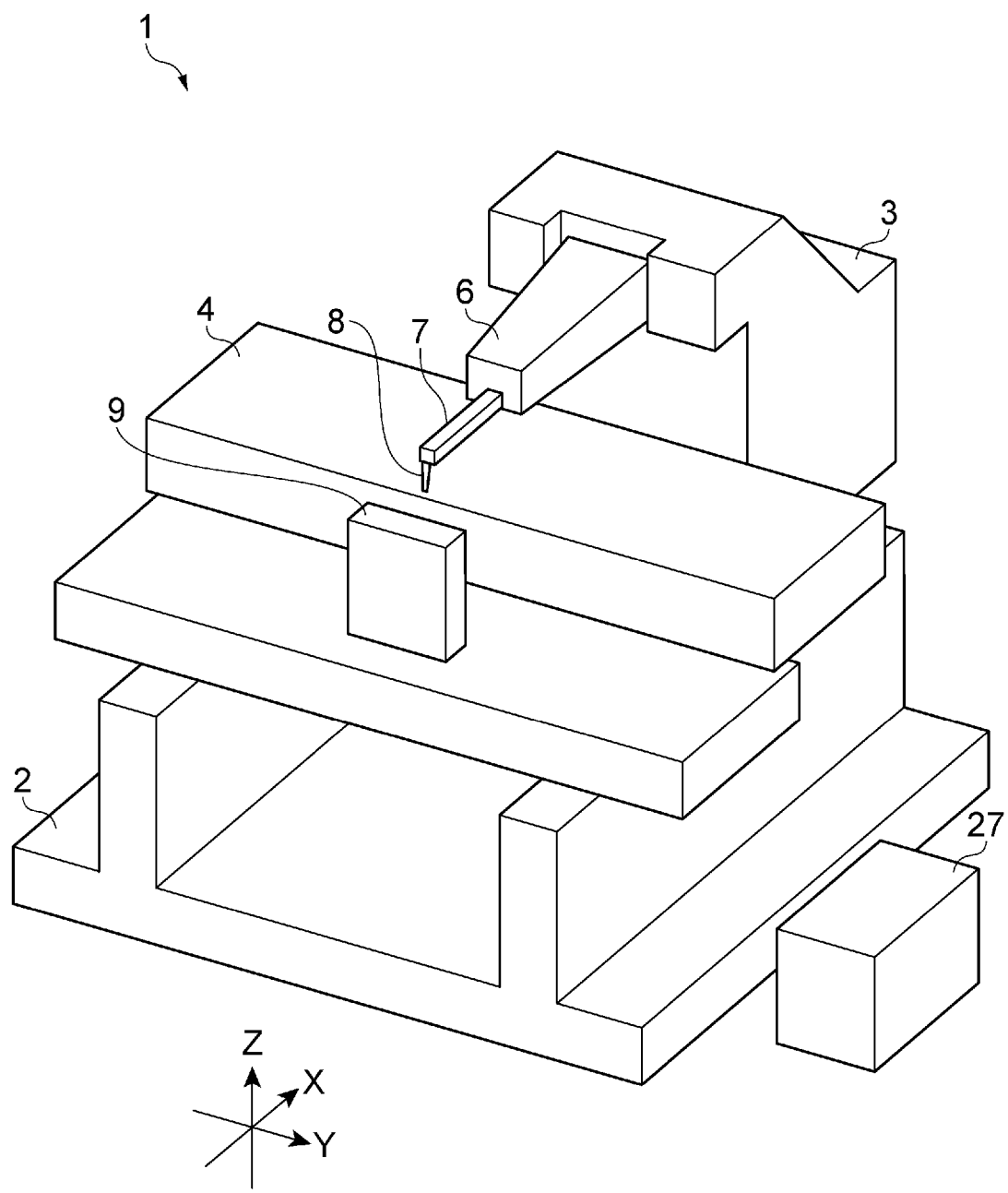
FIG. 1 is a perspective view showing a wire bonding apparatus according to an embodiment.

A wire bonding apparatus 1 shown in FIG. 1 uses a small-diameter metal wire to electrically connect, for example, an electrode of a print substrate or the like to an electrode of a semiconductor element arranged on the print substrate. The wire bonding apparatus 1 supplies heat, an ultrasonic wave, or pressure to a wire to connect the wire to the electrode. The wire bonding apparatus 1 has a base 2, a bonding portion 3 for the above-mentioned connection work, and a transfer portion 4 for transferring the print substrate or the like which is a component to be processed to a bonding area.

The bonding portion 3 includes a bonding tool 6. An ultrasonic horn 7 is arranged at a front end of the bonding tool 6. At a front end of the ultrasonic horn 7, a capillary 8 for supplying the heat, the ultrasonic wave or the pressure to the wire is detachably arranged.

In the following description, a direction in which the ultrasonic horn 7 extends is defined as an X-axis (a second direction). A direction in which the print substrate is transferred by the transfer portion 4 is defined as a Y-axis (a third direction). A direction (a first direction) in which the capillary 8 moves when the bonding operation is performed is defined as a Z-axis.

The capillary 8 is a component that needs to be replaced regularly. Therefore, the wire bonding apparatus 1 has a capillary replacement device 9 for automatically replacing the capillary 8 without operation by a worker.

The capillary replacement device 9 recovers the capillary 8 attached to the ultrasonic horn 7. Furthermore, the capillary replacement device 9 mounts a new capillary 8 to the ultrasonic horn 7. The replacement work of the capillary 8 includes a work of recovering a capillary 8 and a work of mounting a capillary 8. The replacement work of the capillary 8 is automatically carried out when a pre-set condition is satisfied. For example, the condition may be the number of times of the bonding work. That is, the capillary 8 may be replaced every time the bonding work is performed a predetermined number of times.

Figure 2:
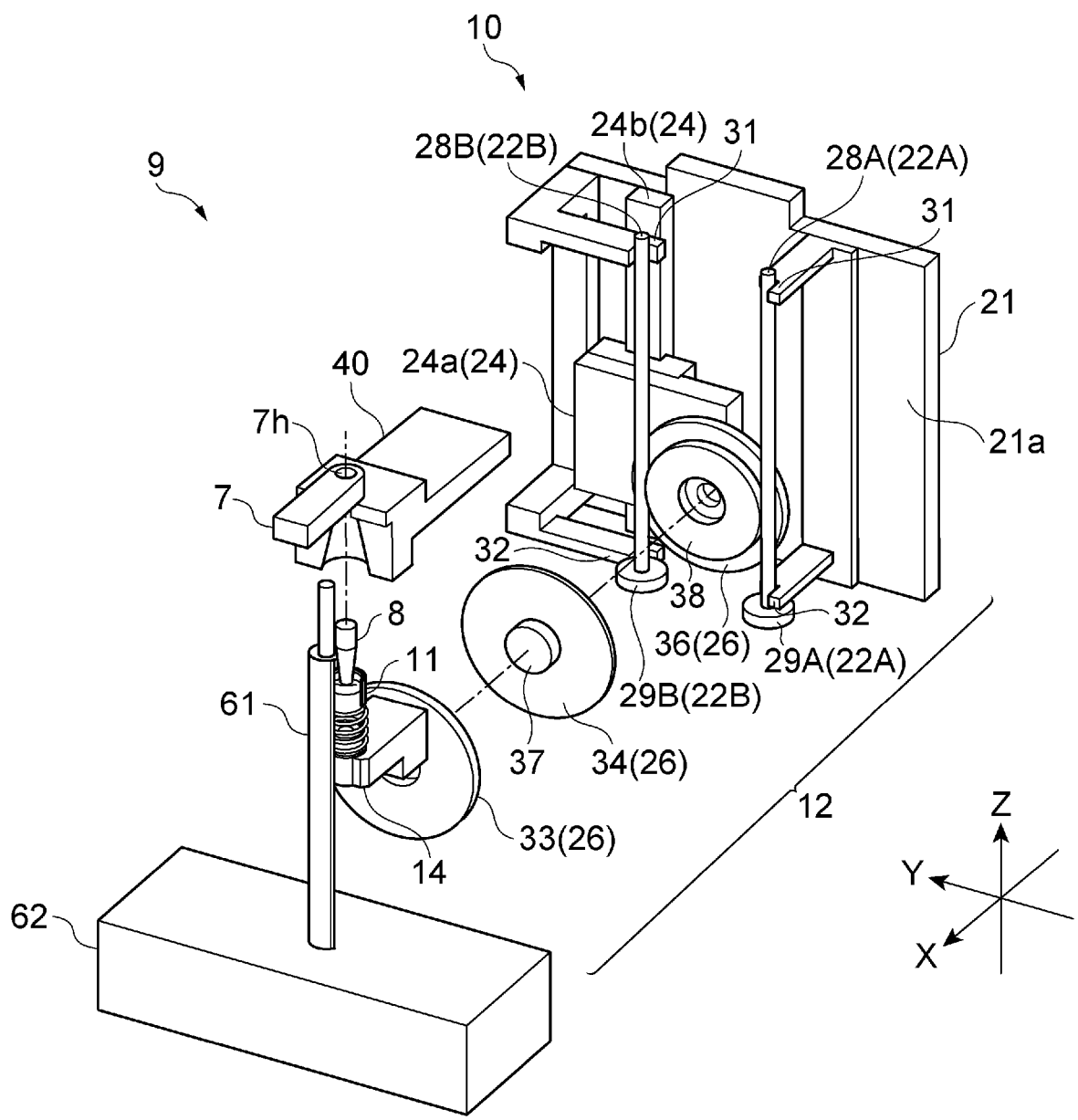
FIG. 2 is an enlarged perspective view showing a capillary replacement device included in the wire bonding apparatus.

As shown in FIG. 2, the capillary replacement device 9 has, as main constituent elements, a capillary transfer device 10 (a mounting portion) and a capillary guide device 40 (a guide portion). The capillary replacement device 9 has, as additional constituent elements, an attachment/detachment jig 61 and a jig drive portion 62. The jig drive portion 62 drives the attachment/detachment jig 61.

<Capillary Transfer Device>

The capillary transfer device 10 detaches the capillary 8 attached to the ultrasonic horn 7. The capillary transfer device 10 transfers the capillary 8 to the ultrasonic horn 7. The capillary transfer device 10 has a capillary holding portion 11 and an actuator 12.

<Capillary Holding Portion>

The capillary holding portion 11 holds the capillary 8. The capillary holding portion 11 is attached to the actuator 12 via the holder 14. The capillary holding portion 11 has a columnar shape extending in a Z-axis direction. A lower end of the capillary holding portion 11 is held by the holder 14. The capillary 8 is detachably inserted into an upper end of the capillary holding portion 11.

Figure 3:
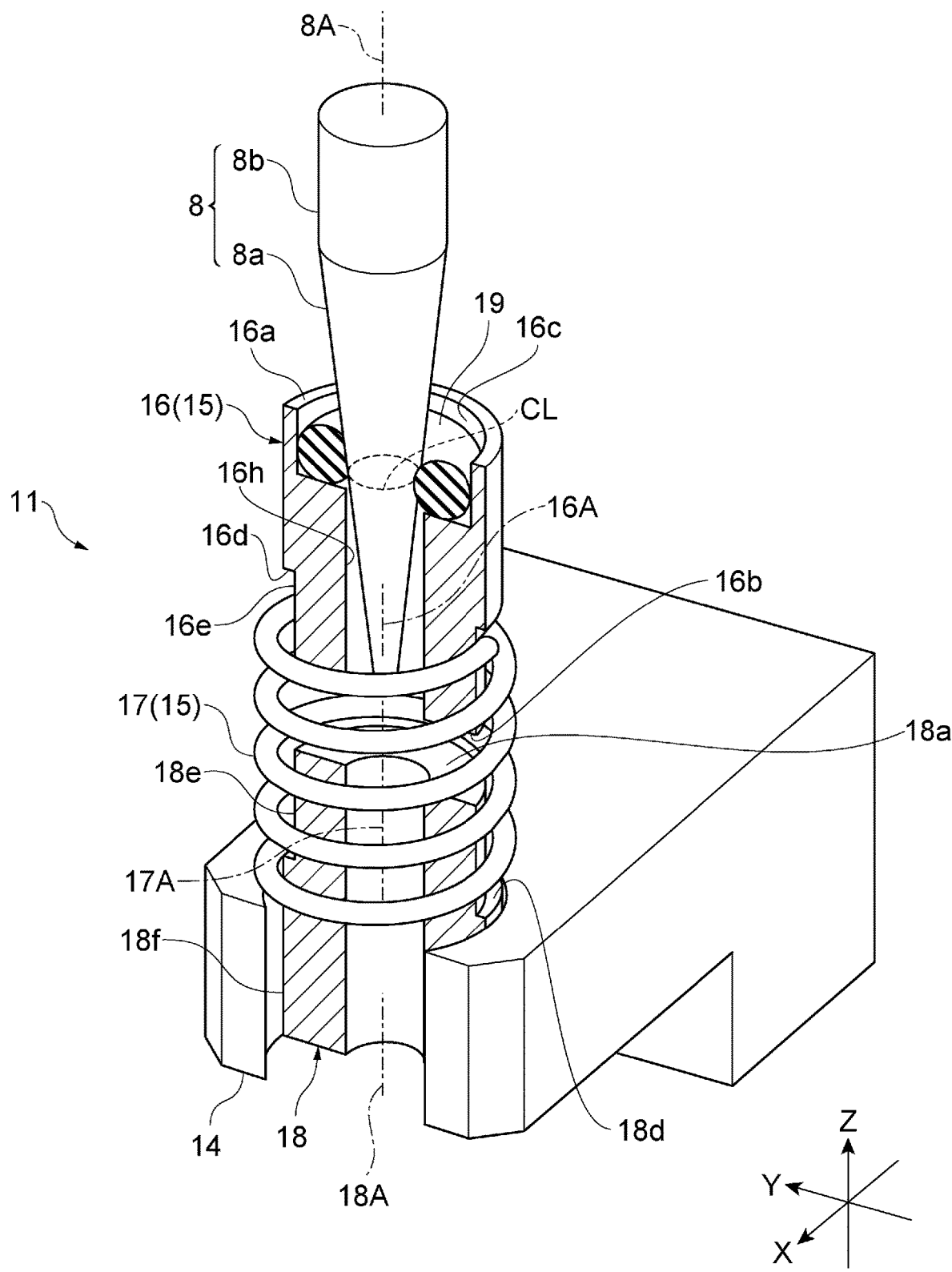
FIG. 3 is a perspective view showing a part of a capillary holding portion in a cross-section view.

As shown in FIG. 3, the capillary holding portion 11 has, as main constituent elements, an upper socket 16, a coil spring 17, a lower socket 18, and an O-ring 19. The upper socket 16, the coil spring 17 and the lower socket 18 are arranged on a common axis. Specifically, the upper socket 16, the coil spring 17, and the lower socket 18 are arranged in this order from the top.

The upper socket 16 has a substantially cylindrical shape. The upper socket 16 has a through hole 16h extending from an upper end surface 16a to a lower end surface 16b. The upper socket 16 holds a tapered surface 8a of the capillary 8. Thus, an inner diameter of the through hole 16h corresponds to an outer diameter of the tapered surface 8a of the capillary 8. For example, the inner diameter of the through hole 16h is smaller than an outer diameter of the capillary body 8b. A counter-bore portion 16c for the O-ring 19 is arranged on the upper end surface 16a side of the through hole 16h. The counter-bore portion 16c has a size capable of accommodating the O-ring 19. A depth of the counter-bore portion 16c is approximately the same as a height of the O-ring 19. An inner diameter of the counter-bore portion 16c is approximately the same as an outer diameter of the O-ring 19.

The O-ring 19 has a so-called torus shape. The O-ring 19 is in direct contact with the tapered surface 8a of the capillary 8. The O-ring 19 holds the capillary 8 in the capillary holding portion 11. The holding is done by an adhesive layer formed on a surface of the O-ring 19. An inner diameter of the O-ring 19 is substantially the same as the inner diameter of the through hole 16h. The tapered surface 8a of the capillary 8 is inserted into the O-ring 19.

The upper socket 16 has a step 16d arranged on an outer peripheral surface. Thus, an outer diameter of the upper end surface 16a is different from an outer diameter of the lower end surface 16b. Specifically, the outer diameter of the lower end surface 16b is slightly smaller than the outer diameter of the upper end surface 16a. The coil spring 17 is fitted in a small-diameter portion 16e on the lower end surface 16b side.

The lower socket 18 has a substantially cylindrical shape. An upper end surface 18a of the lower socket 18 faces the lower end surface 16b of the upper socket 16. The outer shape of the lower socket 18 is the same as the outer shape of the upper socket 16. A step 18d is arranged on an outer peripheral surface of the lower socket 18. In contrast to the upper socket 16, the lower socket 18 is provided with a small-diameter portion 18e on the upper end surface 18a side. The coil spring 17 is also fitted into the small-diameter portion 18e. A large-diameter portion 18f on a lower end surface 18b side of the lower socket 18 is clamped by the holder 14.

The coil spring 17 is a compression spring. An upper end side of the coil spring 17 is fitted into the small-diameter portion 16e of the upper socket 16. A lower end side of the coil spring 17 is inserted into the small-diameter portion 18e of the lower socket 18. The upper socket 16 and the coil spring 17 configure a flexible portion 15. Thus, the upper socket 16 and the lower socket 18 are connected by the coil spring 17. The coil spring 17 has elasticity in a direction of an axis 17A and a direction intersecting the axis 17A. As a result, the upper socket 16 may change a relative position with respect to the lower socket 18.

Figure 4:
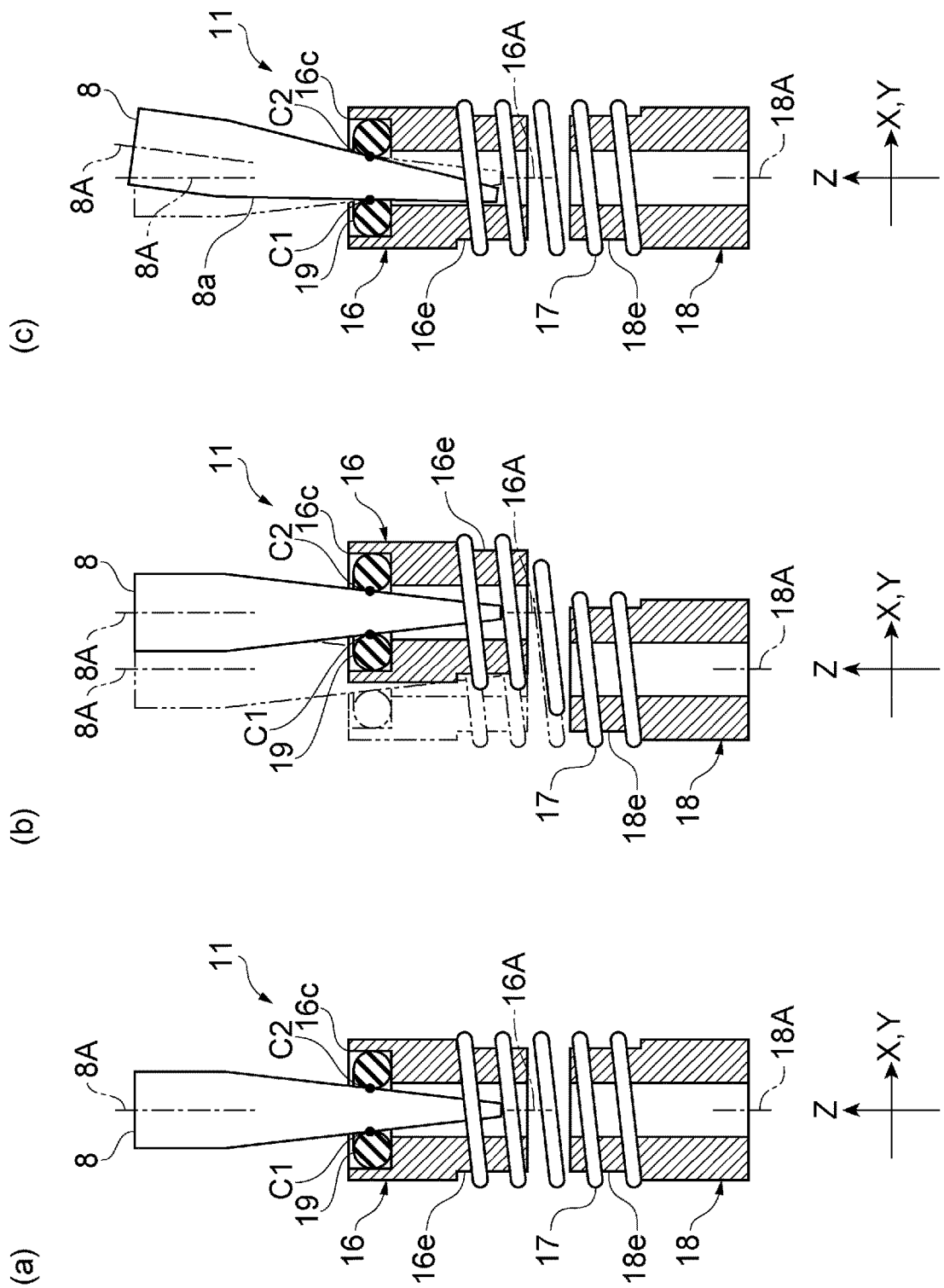
FIG. 4 is a diagram illustrating an operation of the capillary holding portion.

The capillary holding portion 11 having the above configuration has holding modes shown in FIG. 4. Part (a) of FIG. 4 shows the capillary holding portion 11 in an initial mode. Part (b) of FIG. 4 shows the capillary holding portion 11 in a first modified mode. Part (c) of FIG. 4 shows the capillary holding portion 11 in a second modified mode.

As shown in Part (a) of FIG. 4, in the capillary holding portion 11 according to a first holding mode, an axis 16A of the upper socket 16 overlaps an axis 18A of the lower socket 18. Furthermore, an axis 8A of the capillary 8 also overlaps the axes 16A and 18A.

As shown in Part (b) of FIG. 4, in the capillary holding portion 11 according to a second holding mode, the axis 16A of the upper socket 16 does not overlap the axis 18A of the lower socket 18. Specifically, the lower socket 18 is held by the holder 14 and the position of the lower socket 18 is maintained. The upper socket 16 moves in X-axis and Y-axis directions with respect to the lower socket 18. In this state, the axis 16A of the upper socket 16 is parallel to the axis 18A of the lower socket 18.

As shown in Part (c) of FIG. 4, in the capillary holding portion 11 according to a third modification, the axis 16A of the upper socket 16 overlaps the axis 18A of the lower socket 18. That is, these configurations are the same as those of the first holding mode. On the other hand, the axis 8A of the capillary 8 is inclined with respect to the axis 16A of the upper socket 16. Because the O-ring 19 has a torus shape, an inner peripheral surface into which the tapered surface 8a of the capillary 8 is inserted is a curved surface. For example, the cross-sectional shape of the O-ring 19 in a cross section parallel to the Z axis is circular. In a cross-section view of a state in which the tapered surface 8a is inserted into the O-ring 19, the O-ring 19 is in contact with the tapered surface 8a by two contact portions C1 and C2. The O-ring 19 is in line contact in which the O-ring 19 comes into contact with the capillary 8 at an annular contact line CL (see FIG. 3). According to this contact state, inclination of the capillary 8 with respect to the O-ring 19 is allowed.

<Actuator>

As shown in FIG. 2 again, the actuator 12 moves the capillary 8 to be replaced and a new capillary 8. Furthermore, the actuator 12 holds the capillary 8 at a predetermined position and posture. The actuator 12 may reciprocate along a predetermined translational axis (Z axis) direction. In the embodiment, the translational axis is along the vertical direction (Z axis). Thus, the actuator 12 moves the capillary 8 up and down along the vertical direction. Furthermore, the actuator 12 may rotate around the rotation axis (X axis). In the embodiment, the rotation axis is orthogonal to the vertical direction (Z axis). That is, the rotation axis is along the horizontal direction (X axis). Thus, the actuator 12 rotates the capillary 8 around the horizontal direction.

The actuator 12 has an actuator base 21, a pair of linear motors 22A and 22B, a linear guide 24, a carriage 26, and a control device 27 (see FIG. 1).

The actuator base 21 has a flat plate shape. The actuator base 21 has a main surface 21a. A normal line direction of the main surface 21a is along the horizontal direction (the X-axis direction). The linear motors 22A and 22B, the linear guide 24, and the carriage 26 are arranged on the main surface 21a.

The linear motor 22A moves the carriage 26. The linear motor 22A is an ultrasonic motor based on so-called impact drive. The linear motor 22A has a drive shaft 28A and an ultrasonic element 29A. The drive shaft 28A is a round bar made of metal. An axis of the drive shaft 28A is parallel to the main surface 21a of the actuator base 21. The carriage 26 is moved along the drive shaft 28A. Thus, the length of the drive shaft 28A determines a movement range of the carriage 26. A lower end of the drive shaft 28A is fixed to the ultrasonic element 29A. An upper end of the drive shaft 28A is supported by a guide 31 protruding from the main surface 21a of the actuator base 21. The upper end of the drive shaft 28A may be fixed to the guide 31 or may be in contact without being fixed. That is, the lower end of the drive shaft 28A is a fixed end. The upper end of the drive shaft 28A is a fixed end or a free end. In addition, a portion 24b of the linear guide 24 is brought into contact with the guide 31.

The ultrasonic element 29A supplies an ultrasonic wave to the drive shaft 28A. Specifically, the drive shaft 28A to which the ultrasonic wave is supplied slightly reciprocates along the Z-axis. As the ultrasonic element 29A, for example, a piezo element which is a piezoelectric element may be employed. The piezo element deforms according to an applied voltage. Thus, when a high frequency voltage is applied to the piezo element, the piezo element repeatedly deforms according to the frequency of the voltage and the magnitude of the voltage and generates an ultrasonic wave. The ultrasonic element 29A is fixed to a guide 32 protruding from the actuator base 21.

The control device 27 is electrically connected to the ultrasonic element 29A. The ultrasonic element 29A receives a drive voltage generated by the control device 27. The control device 27 controls a frequency and an amplitude of an AC voltage supplied to the ultrasonic element 29A.

The configuration of the linear motor 22B is the same as the configuration of the linear motor 22A. The linear motor 22B is arranged apart from the linear motor 22A in the Y-axis direction that intersects the Z-axis. That is, a drive shaft 28B of the linear motor 22B is parallel to the drive shaft 28A of the linear motor 22A. An upper end of the linear motor 22B is arranged at the same height as the upper end of the linear motor 22A. Similarly, a lower end of the linear motor 22B is arranged at the same height as the lower end of the linear motor 22A.

The carriage 26 is a moving body that is translated and rotated by the linear motors 22A and 22B. The carriage 26 has a disc shape. The carriage 26 is stretched between the linear motors 22A and 22B. The linear guide 24 that guides the carriage 26 in the Z-axis direction is arranged between the actuator base 21 and the carriage 26. The carriage 26 is guided in the Z-axis direction by the linear guide 24. The linear guide 24 regulates a movement direction of the carriage 26. The linear guide 24 does not generate a driving force in the Z-axis direction.

The carriage 26 has a front disc 33, a pressurizing disc 34, and a rear disc 36. These discs have the same outer diameter with each other and are stacked along a common axis. A shaft body 37 is clamped between the front disc 33 and the pressurizing disc 34. An outer diameter of the shaft body 37 is smaller than an outer diameter of the front disc 33 and an outer diameter of the pressurizing disc 34. Thus, a gap is formed between an outer peripheral portion of the front disc 33 and an outer peripheral portion of the pressurizing disc 34. Similarly, a shaft body 38 is also clamped between the rear disc 36 and the pressurizing disc 34. An outer diameter of the shaft body 38 is also smaller than an outer shape of the rear disc 36 and the outer diameter of the pressurizing disc 34. Thus, a gap is also formed between an outer peripheral portion of the rear disc 36 and the outer peripheral portion of the pressurizing disc 34. A first surface 33a of front disc 33 is brought into contact with the holder 14.

A first surface 36b of the rear disc 36 is connected to a table 24a of the linear guide 24. The rear disc 36 is rotatably connected to the table 24a. The pressuring disc 34 and the front disc 33 are mechanically fixed to the rear disc 36. The pressuring disc 34 and the front disc 33 do not rotate with respect to the rear disc 36. Thus, the entire carriage 26 including the front disc 33, the pressurizing disc 34, and the rear disc 36 may rotate with respect to the table 24a of the linear guide 24.

Figure 5:
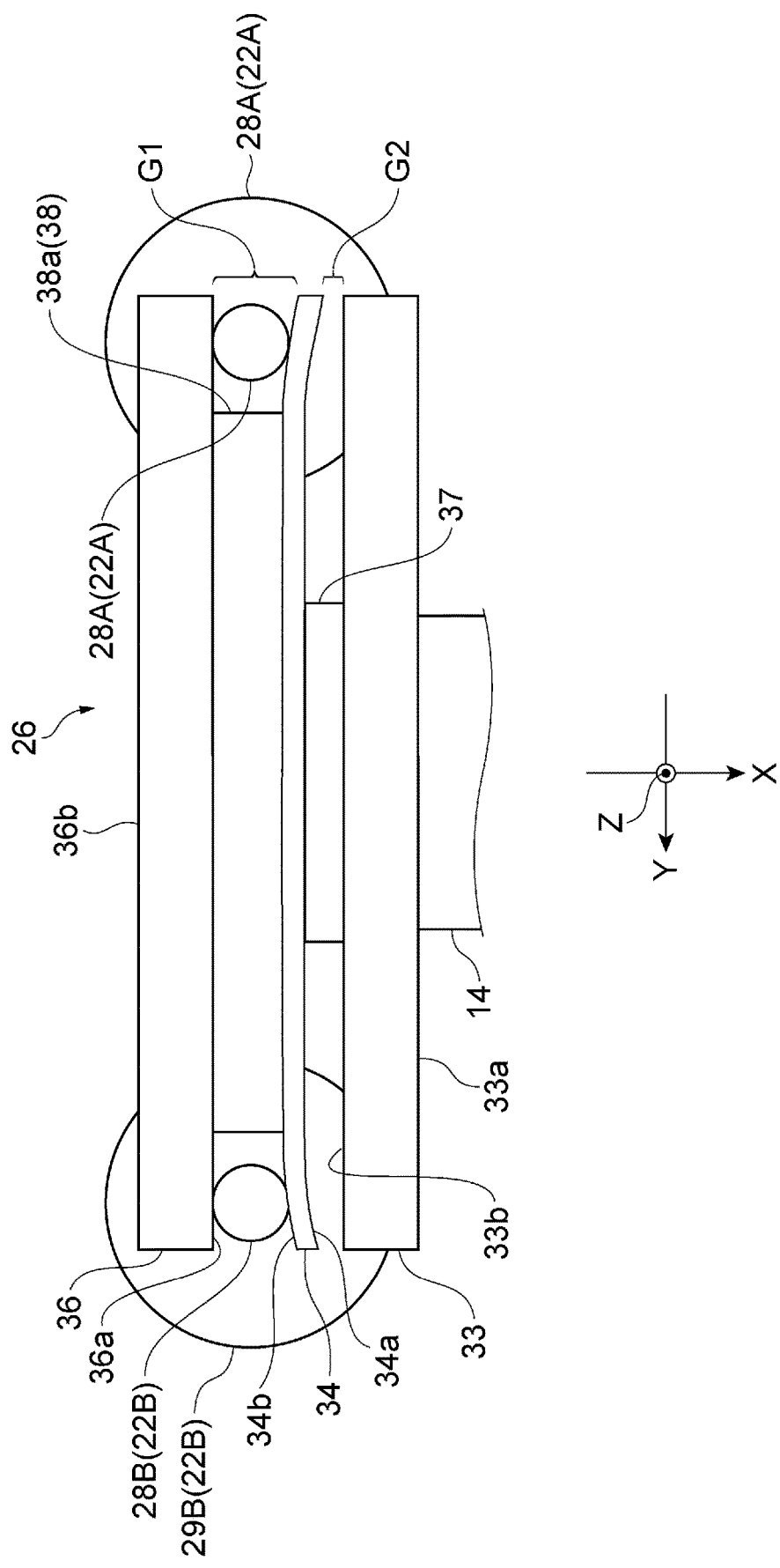
FIG. 5 is a plan view showing a main portion of an actuator included in the capillary replacement device.

As shown in FIG. 5, the drive shafts 28A and 28B are clamped in the gap G1 between the pressurizing disc 34 and the rear disc 36. Specifically, the pair of drive shafts 28A and 28B are arranged to clamp the center of gravity of the carriage 26. The drive shafts 28A and 28B are in contact with a back surface 34b of the pressurizing disc 34 and a main surface 36a of the rear disc 36. The drive shafts 28A and 28B are not in contact with an outer peripheral surface 38a of the shaft body 38. The gap G1 is smaller than the outer diameters of the pressurizing disc 34 and the rear disc 36 and larger than the outer diameter of the shaft body 38. A difference between the outer diameter of the shaft body 38 and the outer diameter of the rear disc 36 is larger than the outer diameters of the drive shafts 28A and 28B. A difference between the outer diameter of the shaft body 37 and the outer diameter of the pressurizing disc 34 is larger than the outer diameters of the drive shafts 28A and 28B.

The gap G1 is slightly smaller than the outer diameters of the drive shafts 28A and 28B. A gap G2 is formed between a second surface 33b of the front disc 33 and an opposite surface 34a of the back surface 34b of the pressurizing disc 34. As a result, when the drive shafts 28A and 28B are arranged between the pressurizing disc 34 and the rear disc 36, the pressurizing disc 34 slightly bends toward the front disc 33 side. The bending generates a force that presses the drive shafts 28A and 28B against the rear disc 36.

Figure 6:
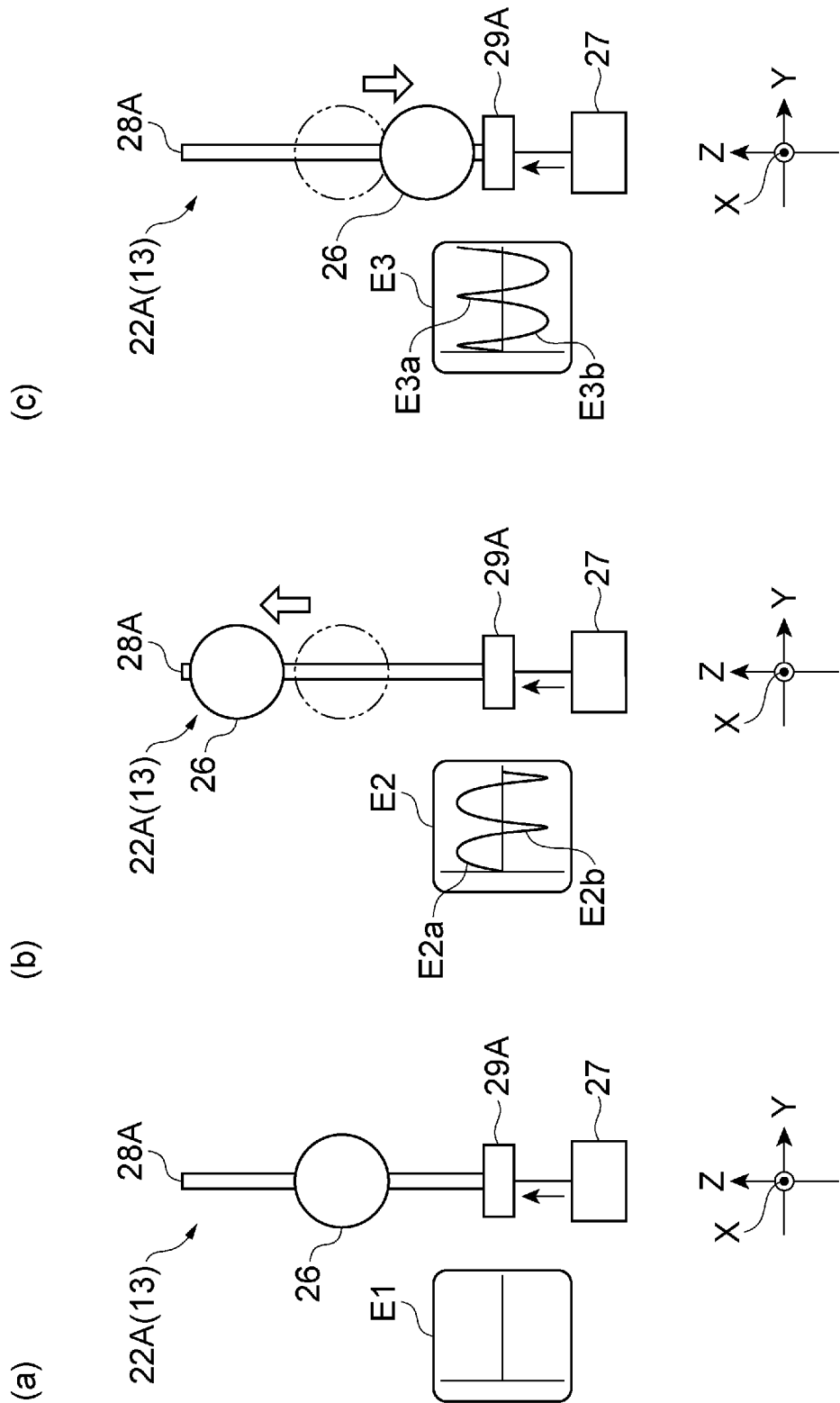
FIG. 6 is a diagram illustrating an operation principle of the actuator.

An operation principle of the actuator 13 is described below with reference to FIG. 6. Parts (a), (b) and (c) of FIG. 6 are diagrams for illustrating the operation principle of the actuator 13. For convenience of description, in FIG. 6, the linear motor 22A and the carriage 26 are shown, and illustration of the linear motor 22B and the like is omitted.

Part (a) of FIG. 6 shows a mode in which a position of the carriage 26 is held. As described above, in the carriage 26, the drive shaft 28A is clamped between the pressurizing disc 34 and the rear disc 36. The position of the carriage 26 is maintained by the pressure applied by the clamping. More specifically, the position of the carriage 26 is maintained by the frictional resistance force which takes the applied pressure as a normal force. At this time, the control device 27 does not supply a voltage to the ultrasonic element 29A (voltage value zero, see signal E1). Alternatively, the control device 27 may supply a DC current having a predetermined voltage value to the ultrasonic element 29A.

As described above, the position of the carriage 26 is maintained by the frictional resistance force between the carriage 26 and the drive shaft 28A. Here, when the drive shaft 28A is moved, a mode in which the carriage 26 is moved along with the drive shaft 28A and a mode in which the carriage 26 is not moved along with the drive shaft 28A and the position is maintained by inertia of the carriage 26 may occur. Which of these modes is achieved may be determined by a speed at which the drive shaft 28A is moved, that is, a frequency of the ultrasonic wave. For example, when the frequency is relatively low (15 kHz to 30 kHz), the carriage 26 is moved along with the drive shaft 28A. For example, when the frequency is relatively high (100 kHz to 150 kHz), the carriage 26 maintains the position without moving along with the drive shaft 28A.

For example, as shown in Part (b) of FIG. 6, when the drive shaft 28A is moved in an upward direction (positive direction), the carriage 26 is also moved along with the movement of the drive shaft 28A. That is, the relative positional relationship between the drive shaft 28A and the carriage 26 does not change. Besides, when the drive shaft 28A is moved in a downward direction (negative direction), the carriage 26 is not moved along with downward movement of the drive shaft 28A. That is, the relative positional relationship between the drive shaft 28A and the carriage 26 changes. When these operations are repeated, the carriage 26 gradually moves upward. That is, by making a cycle of a voltage (a symbol E2a in the signal E2) for moving the drive shaft 28A upwards longer than a cycle of a voltage (a symbol E2b in the signal E2) for moving the drive shaft 28A downward, the carriage 26 may be moved upwards.

On the contrary, as shown in Part (c) of FIG. 6, when the drive shaft 28A is moved downward, the carriage 26 is also moved along with the movement of the drive shaft 28A. That is, the relative positional relationship between the drive shaft 28A and the carriage 26 does not change. Besides, when the drive shaft 28A is moved upward, the carriage 26 is not moved along with upward movement of the drive shaft 28A. That is, the relative positional relationship between the drive shaft 28A and the carriage 26 changes. When these operations are repeated, the carriage 26 gradually moves downward. That is, by making a cycle of a voltage (a symbol E3a in a signal E3) for moving the drive shaft 28A upward shorter than a cycle of a voltage (a symbol E3b in the signal E3) for moving the drive shaft 28A downward, the carriage 26 may be moved downward.

Moreover, when the carriage 26 is moved downward, the carriage 26 may not follow both the upward and downward movements of the drive shaft 28A, in addition to the above control. That is, the frictional resistance force between the carriage 26 and the drive shaft 28A is apparently smaller than gravity acting on the carriage 26. As a result, the carriage 26 appears to fall. In this mode, the gravity acting on the carriage 26 is used as a force for moving the carriage 26 downward.

Next, a specific operation of the actuator 12 is described with reference to FIGS. 7 and 8.

Figure 7:
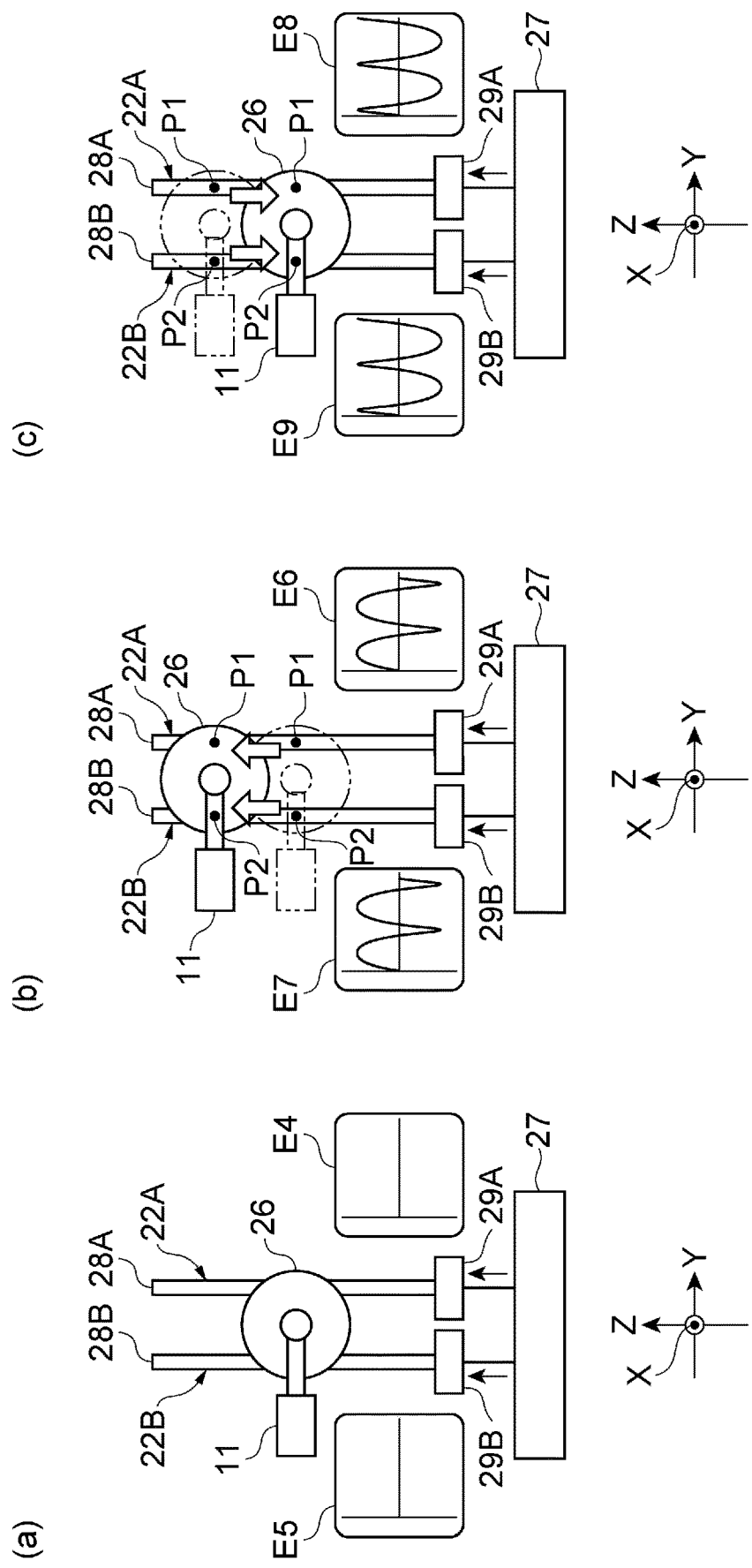
FIG. 7 is a diagram illustrating specific control of the actuator.

Part (a) of FIG. 7 shows an operation of maintaining the position of the carriage 26. As described above, when the position of the carriage 26 is maintained, the control device 27 supplies a constant voltage (see signals E4 and E5 in part (a) of FIG. 7) to the respective ultrasonic elements 29A and 29B. Alternatively, the control device 27 does not supply a voltage to either of the ultrasonic elements 29A and 29B.

Part (b) of FIG. 7 shows an operation of moving the carriage 26 upward. At this time, the control device 27 supplies, to the ultrasonic element 29A, an AC voltage (see a signal E6 in Part (b) of FIG. 7) in which the cycle of the voltage for moving the drive shaft 28A upward is made longer than the cycle of the voltage for moving the drive shaft 28A downward. Similarly, the control device 27 also supplies, to the ultrasonic element 29B, an AC voltage (see a signal E7 in Part (b) of FIG. 7) in which the cycle of the voltage for moving the drive shaft 28B upward is made longer than the cycle of the voltage for moving the drive shaft 28B downward. That is, the control device 27 supplies the same AC voltage to both the ultrasonic elements 29A and 29B. Besides, the control device 27 makes a timing of moving the drive shaft 28A upward match a timing of moving the drive shaft 28B upward. That is, the control device 27 makes a phase of the voltage supplied to the ultrasonic element 29A the same as a phase of the voltage supplied to the ultrasonic element 29B. Then, a contact portion P1 where the drive shaft 28A is pressed against the pressurizing disc 34 and the rear disc 36 and a contact portion P2 where the drive shaft 28B is pressed against the pressurizing disc 34 and the rear disc 36 are moved upward by the same distance. As a result, the contact portions P1 and P2 are moved upward while maintaining a parallel state. That is, the carriage 26 is translated upward without rotating around the center of gravity.

Part (c) of FIG. 7 shows an operation of moving the carriage 26 downward. At this time, the control device 27 supplies, to the ultrasonic element 29A, an AC voltage (see a signal E8 in Part (c) of FIG. 7) in which the cycle of the voltage for moving the drive shaft 28A upward is made shorter than the cycle of the voltage for moving the drive shaft 28A downward. Similarly, the control device 27 also supplies, to the ultrasonic element 29B, an AC voltage (see a signal E9 in Part (c) of FIG. 7) in which the cycle of the voltage for moving the drive shaft 28B upward is made shorter than the cycle of the voltage for moving the drive shaft 28B downward. Then, the contact portion P1 where the drive shaft 28A is pressed against the pressurizing disc 34 and the rear disc 36 and the contact portion P2 where the drive shaft 28B is pressed against the pressurizing disc 34 and the rear disc 36 are moved downward by the same distance. As a result, the contact portions P1 and P2 are moved downward while maintaining a parallel state. That is, the carriage 26 is translated downward without rotating around the center of gravity.

According to the above control, when the carriage 26 is moved downward, the frictional resistance forces act between the carriage 26 and the drive shafts 28A and 28B, and respective relative positions do not change. Thus, the carriage 26 does not rotate around the center of gravity. As a result, for example, even when torque that causes the carriage 26 to rotate due to the posture of the capillary 8 held by the carriage 26, the rotation of the carriage 26 may be suppressed and the carriage 26 may be moved downward.

Moreover, one linear motor 22A can also realize translation of moving the carriage 26 upward and downward. Because the actuator 12 according to the embodiment has the two linear motors 22A and 22B, a propulsive force can be increased as compared with the configuration having one linear motor 22A.

Part (a) of FIG. 8 shows an operation of rotating the carriage 26 in a clockwise direction. At this time, the control device 27 supplies, to the ultrasonic element 29A, an AC voltage (see a signal E10 in Part (a) of FIG. 8) in which the cycle of the voltage for moving the drive shaft 28A upward is made shorter than the cycle of the voltage for moving the drive shaft 28A downward. On the other hand, the control device 27 supplies, to the ultrasonic element 29B, an AC voltage (see a signal E11 in Part (a) of FIG. 8) in which the cycle of the voltage for moving the drive shaft 28B upward is made longer than the cycle of the voltage for moving the drive shaft 28B downward. That is, the control device 27 makes the voltage supplied to the ultrasonic element 29A and the voltage supplied to the ultrasonic element 29B different from each other. Besides, the control device 27 makes the timing of moving the drive shaft 28A upward match the timing of moving the drive shaft 28B upward. The control device 27 makes the phase of the voltage supplied to the ultrasonic element 29A and the phase of the voltage supplied to the ultrasonic element 29B opposite to each other. Then, the contact portion P1 where the drive shaft 28A is pressed against the pressurizing disc 34 and the rear disc 36 is moved downward, and the contact portion P2 where the drive shaft 28B is pressed against the pressurizing disc 34 and the rear disc 36 is moved upward. The contact portions P1 and P2 are moved in mutually opposite directions. If movement amounts of the two contact portions match, the contact portions P1 and P2 are rotated clockwise while positions of the contact portions P1 and P2 are maintained in the Z-axis direction.

Part (b) of FIG. 8 shows an operation of rotating the carriage 26 in a counter-clockwise direction. At this time, the control device 27 supplies, to the ultrasonic element 29A, an AC voltage (see a signal E12 in Part (b) of FIG. 8) in which the cycle of the voltage for moving the drive shaft 28A upward is made longer than the cycle of the voltage for moving the drive shaft 28A downward. On the other hand, the control device 27 supplies, to the ultrasonic element 29B, an AC voltage (see a signal E13 in Part (b) of FIG. 8) in which the cycle of the voltage for moving the drive shaft 28B upward is made shorter than the cycle of the voltage for moving the drive shaft 28B downward. Then, the contact portion P1 where the drive shaft 28A is pressed against the pressurizing disc 34 and the rear disc 36 is moved upward. The contact portion P2 where the drive shaft 28B is pressed against the pressurizing disc 34 and the rear disc 36 is moved downward. The contact portions P1 and P2 are moved in mutually opposite directions. If the movement amounts of the two contact portions match, the contact portions P1 and P2 are rotated counter-clockwise while positions of the contact portions P1 and P2 are maintained in the Z-axis direction.

<Capillary Guide Device>

As shown in FIG. 2 again, the capillary guide device 40 guides the capillary 8 when inserting the capillary 8 into a hole 7h (a capillary holding hole) of the ultrasonic horn 7. The capillary guide device 40 is arranged in the actuator 12. Thus, the capillary guide device 40 preserves a relative positional relationship with the components configuring the actuator 12. The capillary guide device 40 has a cantilever shape extending from the actuator 12 toward the ultrasonic horn 7.

Figure 9:
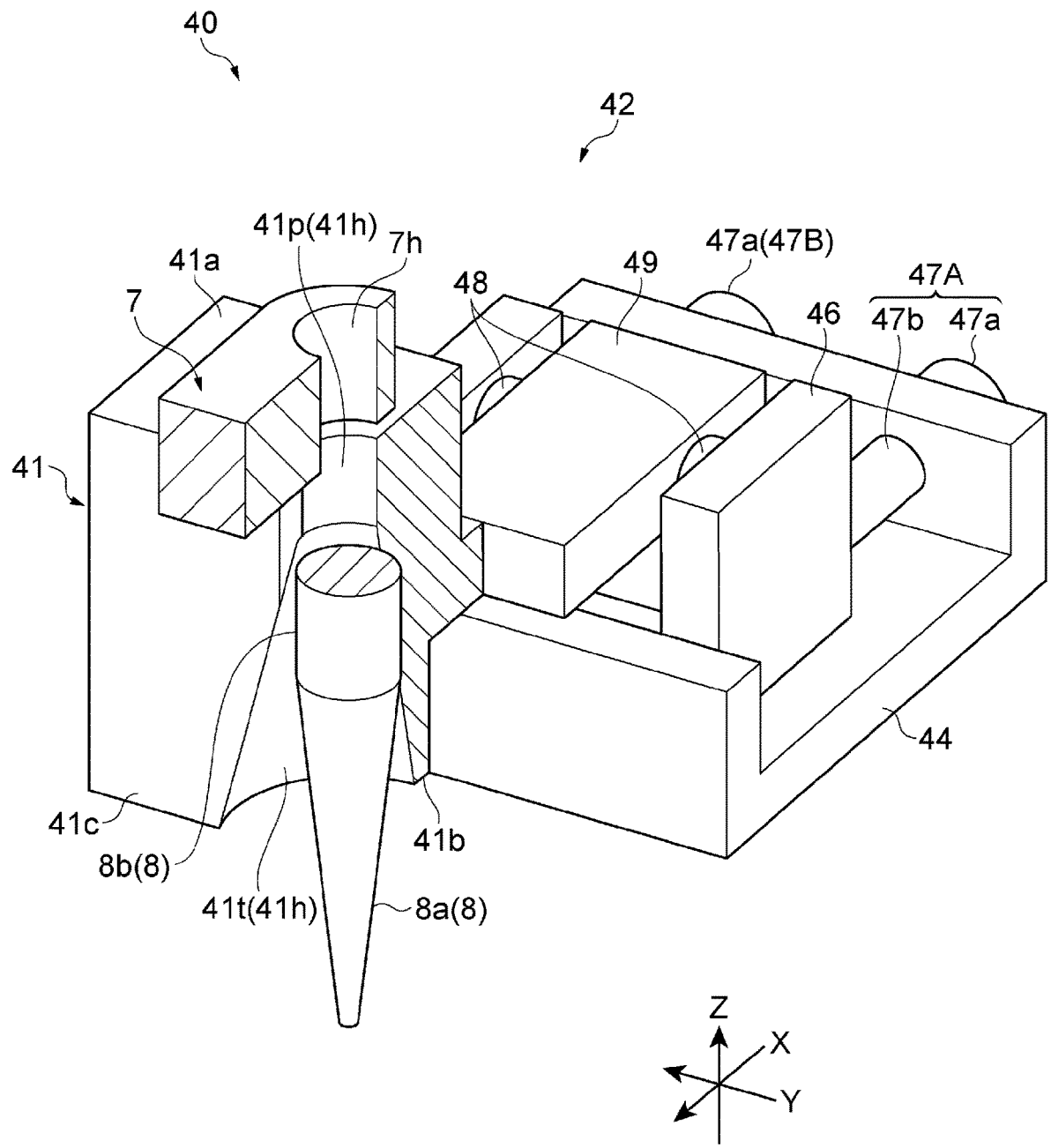
FIG. 9 is a perspective view showing a part of a capillary guide device in a cross-section view.
Figure 10:
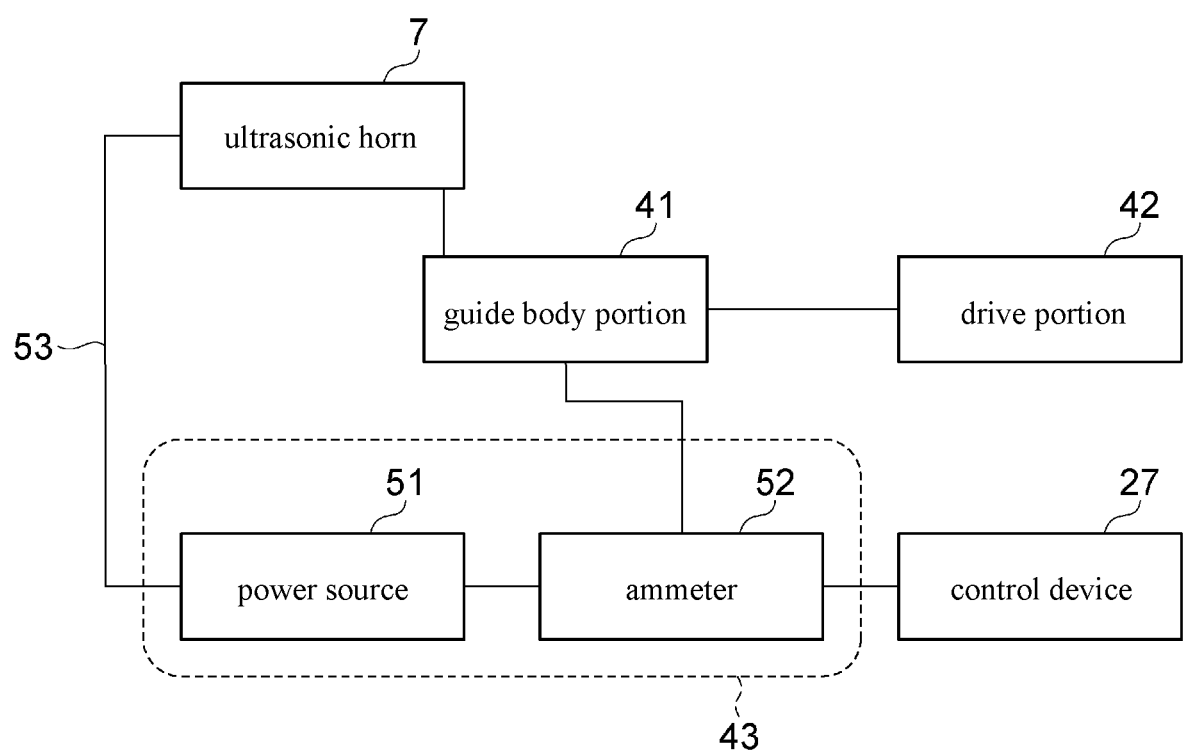
FIG. 10 is a function block diagram of the capillary guide device.

FIG. 9 is a perspective view in which a main portion of the capillary guide device 40 is cross-sectionally viewed. FIG. 10 is a function block diagram showing the capillary guide device 40. The capillary guide device 40 includes a guide body portion 41, a drive portion 42, and a contact detection portion 43 (see FIG. 10).

The guide body portion 41 has a guide hole 41h arranged at a free end of the guide body portion 41. The guide hole 41h receives the capillary body 8b of the capillary 8. Then, the guide hole 41h guides the capillary 8 to the hole 7h of the ultrasonic horn 7. The guide hole 41h is a through hole extending from a main surface 41a of the capillary guide device 40 to a back surface 41b. The guide hole 41h is also opened in a front end surface 41c of the capillary guide device 40. The guide hole 41h receives the capillary 8 from the back surface 41b and the front end surface 41c.

The guide hole 41h includes a tapered hole portion 41t (tapered surface) and a parallel hole portion 41p (guided surface). A lower end of the tapered hole portion 41t is opened in the back surface 41b. An upper end of the parallel hole portion 41p is opened in the main surface 41a. An inner diameter of the tapered hole portion 41t on the back surface 41b is larger than an inner diameter of the parallel hole portion 41p on the main surface 41a. This inner diameter is larger than an outer diameter at the upper end of the capillary 8. An inner diameter of the guide hole 41h gradually decreases from the back surface 41b toward the main surface 41a. The inner diameter of the guide hole 41h has a minimum value at a position where the tapered hole portion 41t and the parallel hole portion 41p are connected. This inner diameter is substantially the same as the outer diameter at the upper end of the capillary 8. Besides, the inner diameter of the parallel hole portion 41p is constant.

The drive portion 42 brings the guide body portion 41 close to and away from the capillary 8. The drive portion 42 separates the guide body portion 41 from the capillary 8 when the replacement work of the capillary 8 is not performed. The drive portion 42 brings the guide body portion 41 into contact with the capillary 8 when the replacement work of the capillary 8 is performed. The drive portion 42 vibrates the guide body portion 41 when the replacement work of the capillary 8 is performed.

The drive portion 42 includes a drive body portion 44, a table 46 (moving body), linear motors 47A and 47B, an ultrasonic element 48 (a vibration generation portion), and a connection portion 49. The drive body portion 44 is fixed to the actuator base 21. The table 46 is movable with respect to the drive body portion 44. The table 46 is moved in a direction approaching the capillary 8 and a direction away from the capillary 8. These directions are parallel to the X-axis direction. The table 46 reciprocates along the X-axis direction. The drive portion 42 has the two linear motors 47A and 47B. The number of the linear motor may be one.

The linear motors 47A and 47B guide the table 46 in the X-axis direction and supply a driving force along the X-axis direction to the table 46. The linear motors 47A and 47B are ultrasonic motors based on so-called impact drive. The linear motors 47A and 47B each have an ultrasonic element 47a (ultrasonic wave generator) and a drive shaft 47b. The drive shaft 47b is a round bar made of metal. An axis of the drive shaft 47b is parallel to the X-axis direction. The drive shaft 47b is disposed in a groove arranged in the table 46. The drive shaft 47b is pressed against the wall surface of the groove with a predetermined force by a leaf spring member. A predetermined frictional resistance force is generated between the wall surface of the groove and an outer peripheral surface of the drive shaft 47b. When an external force along the X-axis direction acts on the table 46, the frictional resistance force opposes the external force. Thus, when the external force is smaller than the frictional resistance force, the table 46 is not moved. When the external force is larger than the frictional resistance force, the table 46 is moved.

The ultrasonic element 47a is arranged at an end of the drive shaft 47b. The ultrasonic element 47a supplies an ultrasonic wave to the drive shaft 47b. As the ultrasonic element 29A, for example, a piezo element which is a piezoelectric element may be employed. The ultrasonic element 47a is fixed to the drive body portion 44. A driving force is supplied to the table 46 by controlling a frequency of the ultrasonic wave generated by the ultrasonic element 47a. The direction of this driving force is the direction in which the table 46 approaches the capillary 8 (hereinafter referred to as the "positive X-axis direction") and the direction in which the table 46 moves away from the capillary 8 (hereinafter referred to as the "negative X-axis direction"). The relationship between the movement of the table 46 and a signal supplied to the ultrasonic element 47*a* (for example, a signal E14 shown in FIG. 14) is described later.

The ultrasonic element 48 is fixed to the table 46 and the connection portion 49. The ultrasonic element 48 supplies the ultrasonic wave to the connection portion 49. A vibration direction of the ultrasonic element 48 is orthogonal to the drive shaft 47*b*. In other words, the ultrasonic element 48 vibrates the connection portion 49 in the Y-axis direction. This vibration is transmitted to the guide body portion 41 via the connection portion 49. The operation of the ultrasonic element 48 may be performed as needed.

The contact detection portion 43 shown in FIG. 10 detects that the ultrasonic horn 7 is in contact with the guide body portion 41. The contact detection portion 43 is an electrical contact detection mechanism that does not interfere with effects of the guide body portion 41 and the drive portion 42. The contact detection portion 43 includes a power source 51 (a voltage supply portion) and an ammeter 52 (an information acquisition portion). A first output of the power source 51 is electrically connected to the ultrasonic horn 7. A second output of the power source 51 is electrically connected to the guide body portion 41. According to this configuration, a predetermined potential difference is generated between the ultrasonic horn 7 and the guide body portion 41. Besides, the ammeter 52 is arranged on a path 53 that electrically connects the ultrasonic horn 7 and the guide body portion 41. When the capillary 8 is not replaced, the ultrasonic horn 7 is separated from the guide body portion 41. Thus, no current flows in the path 53. As a result, the control device 27 may recognize that the ultrasonic horn 7 and the guide body portion 41 are separated from each other based on a fact that an output of the ammeter 52 is zero. On the other hand, the ultrasonic horn 7 and the guide body portion 41 are in contact with each other for a predetermined period in the work of replacing the capillary 8. Thus, a current flows through the path 53. As a result, the control device 27 may recognize that the ultrasonic horn 7 and the guide body portion 41 are in contact with each other based on a fact that a signal indicating that the current is flowing is output from the ammeter 52.

The contact between the ultrasonic horn 7 and the guide body portion 41 may be detected based on the potential difference generated between the ultrasonic horn 7 and the guide body portion 41. In this case, the contact detection portion 43 has a voltmeter instead of the ammeter. When the ultrasonic horn 7 and the guide body portion 41 are not in contact with each other, the voltmeter outputs a predetermined voltage value supplied by the power source 51. On the other hand, when the ultrasonic horn 7 and the guide body portion 41 are in contact with each other, because a current flows between the ultrasonic horn 7 and the guide body portion 41, the voltage value decreases. The contact between the ultrasonic horn 7 and the guide body portion 41 may be detected based on change in the voltage value.

<Replacement Operation>

Next, the capillary replacement operation performed by the above capillary replacement device 9 is described.

Part (a) of FIG. 11 shows a state immediately before replacing a capillary 8U attached to the ultrasonic horn 7. The capillary replacement device 9 has, in addition to the aforementioned capillary holding portion 11, the capillary guiding device 40 and the actuator 12, a capillary stocker 54 and a capillary recovery portion 55 as additional constituent elements. The capillary stocker 54 accommodates a plurality of capillaries 8N for replacement. In addition, the capillary recovery portion 55 accommodates the used capillary 8U.

A state shown in Part (a) of FIG. 11 is, for example, a state in which a wire bonding work is being performed by the capillary 8U attached to the ultrasonic horn 7. Thus, the capillary replacement device 9 may be retracted to a position that does not hinder the wire bonding work.

Part (b) of FIG. 11 shows a state of a first step in the replacement operation. First, the capillary replacement device 9 rotates the carriage 26 in the clockwise direction by the control device 27. This rotation corresponds to the operation shown in Part (a) of FIG. 8. By this rotation, the capillary holding portion 11 retracted to the position where the wire bonding work is not hindered is positioned below the capillary 8U.

Part (a) of FIG. 12 and Part (b) of FIG. 12 show a state of a second step in the replacement operation. In the second step, the guide body portion 41 is brought into contact with the capillary 8. First, the control device 27 supplies the signal E14 to the ultrasonic element 47*a*. This signal E14 moves the table 46 in the positive X-axis direction. The ultrasonic wave includes amplitude toward the positive X-axis direction (hereinafter referred to as "positive amplitude") and amplitude toward the negative X-axis direction (hereinafter referred to as "negative amplitude"). Modes of the drive shaft 47*b* and the table 46 differ depending on the frequency of the ultrasonic wave. For example, when the frequency of the ultrasonic wave is relatively low (15 kHz or more and 30 kHz or less), the table 46 is also moved along with the movement of the drive shaft 47*b*. On the other hand, when the frequency of the ultrasonic wave is relatively high (100 kHz or more and 150 kHz or less), the drive shaft 47*b* is not moved along with the movement of the table 46. In other words, the drive shaft 47*b* is moved with respect to the table 46.

According to the above modes, the control device 27 generates, as shown by the signal E14 in Part (b) of FIG. 12, a control signal which repeats a signal component having a positive amplitude and a relatively low frequency and a signal component having a negative amplitude and a relatively high frequency. As a result, the table 46 is moved in the positive X-axis direction. Then, when the parallel hole portion 41*p* of the guide body portion 41 comes into contact with the capillary 8, the control device 27 stops supplying the control signal. When the guide body portion 41 is in contact with the capillary 8, no pressing force acts on the capillary 8 from the guide body portion 41. That is, the guide body portion 41 is merely in contact with the capillary 8.

In the second step, an operation of vibrating the guide body portion 41 is also performed in parallel with the operation of moving the guide body portion 41. The control device 27 supplies the control signal to the ultrasonic element 48. As a result, the ultrasonic element 48 supplies the ultrasonic wave to the guide body portion 41 via the connection portion 49. According to this vibration, the capillary 8 can be satisfactorily guided to the parallel hole portion 41*p*.

Part (a) of FIG. 13 shows a state of a third step in the replacement operation. In the third step, the ultrasonic horn 7 is brought into contact with the guide body portion 41. The control device 27 supplies a control signal to the bonding portion 3. As a result, the ultrasonic horn 7 descends. In other words, the control device 27 moves the ultrasonic horn 7 in the negative Z-axis direction. The control device 27 monitors the output of the ammeter 52 while moving the ultrasonic horn 7. When a predetermined change appears in the output of the ammeter 52, the control device 27 determines that a lower surface 7*a* of the ultrasonic horn 7 is in contact with the main surface 41*a* of the guide body portion 41. This predetermined change may be, for example, a case when the output of the ammeter 52 changes from zero (non-contact) to a predetermined value. Then, the control device 27 stops the descent of the ultrasonic horn 7.

Part (b) of FIG. 13 shows a state of a fourth step in the replacement operation. In the fourth step, the capillary 8U is mounted to the capillary holding portion 11. The capillary replacement device 9 moves the carriage 26 upward by the control device 27. This movement corresponds to the operation shown in Part (b) of FIG. 7. By this movement, the capillary holding portion 11 holds the capillary 8U attached to the ultrasonic horn 7.

Part (a) of FIG. 14 and Part (b) of FIG. 14 show a state of a fifth step in the replacement operation. In the fifth step, the capillary 8U is pulled out from the ultrasonic horn 7. The capillary replacement device 9 moves the carriage 26 downward by the control device 27. This movement corresponds to the operation shown in Part (c) of FIG. 7. By this movement, the capillary 8U held by the capillary holding portion 11 is detached from the ultrasonic horn 7. The guide body portion 41 is only in contact with the capillary 8U. The guide body portion 41 does not generate a force toward the capillary 8U. As a result, even if the capillary 8U is detached, the guide body portion 41 continues to keep its position. In other words, the detachment of the capillary 8U does not cause significant movement in the positive X-axis direction. As a result, the relative positional relationship between the guide body portion 41 and the ultrasonic horn 7 is preserved.

Part (a) of FIG. 15 shows a state of a sixth step in the replacement operation. In the sixth step, the detached capillary 8U is transferred. The capillary replacement device 9 rotates the carriage 26 by the control device 27 in the clockwise direction. This movement corresponds to the operation shown in Part (a) of FIG. 8. By this movement, the capillary 8U held by the capillary holding portion 11 is transferred to the capillary recovery portion 55 and recovered as a used capillary 8U.

Part (b) of FIG. 15 shows a state of a seventh step in the replacement operation. In the seventh step, a new capillary 8N is held. The capillary replacement device 9 rotates the carriage 26 by the control device 27 in the counter-clockwise direction. This movement corresponds to the operation shown in Part (b) of FIG. 8. By this movement, the capillary holding portion 11 holds a new capillary 8N for replacement.

Part (a) of FIG. 16 shows a state of an eighth step in the replacement operation. In the eighth step, the new capillary 8N is transferred to the lower side of the ultrasonic horn 7. The capillary replacement device 9 rotates the carriage 26 by the control device 27 in the clockwise direction. This movement corresponds to the operation shown in Part (a) of FIG. 8. By this movement, the new capillary 8N held by the capillary holding portion 11 is positioned below the hole 7h of the ultrasonic horn 7.

Part (b) of FIG. 16 shows a state of a ninth step in the replacement operation. In the ninth step, the capillary 8N is inserted into the hole 7h. The capillary replacement device 9 moves the carriage 26 upward by the control device 27. This movement corresponds to the operation shown in Part (b) of FIG. 7. By this movement, the new capillary 8N held by the capillary holding portion 11 is inserted into the hole 7h of the ultrasonic horn 7. In this insertion, the action of the capillary holding portion 11 and the capillary guide device 40 eliminates deviation between the capillary 8N and the capillary guide device 40 and deviation between the capillary 8N and the hole 7h of the ultrasonic horn 7.

A mounting operation of the capillary 8N in the ninth step is described in detail with reference to FIGS. 17 and 18. In a state shown in Part (a) of FIG. 17, an axis 7A of the hole 7h of the ultrasonic horn 7 overlaps an axis 41A of the guide hole 41h of the guide body portion 41. On the other hand, the axis 8A of the capillary 8N held by the capillary holding portion 11 is deviated parallel to the X-axis direction with respect to the axes 7A and 41A.

Figure 17:
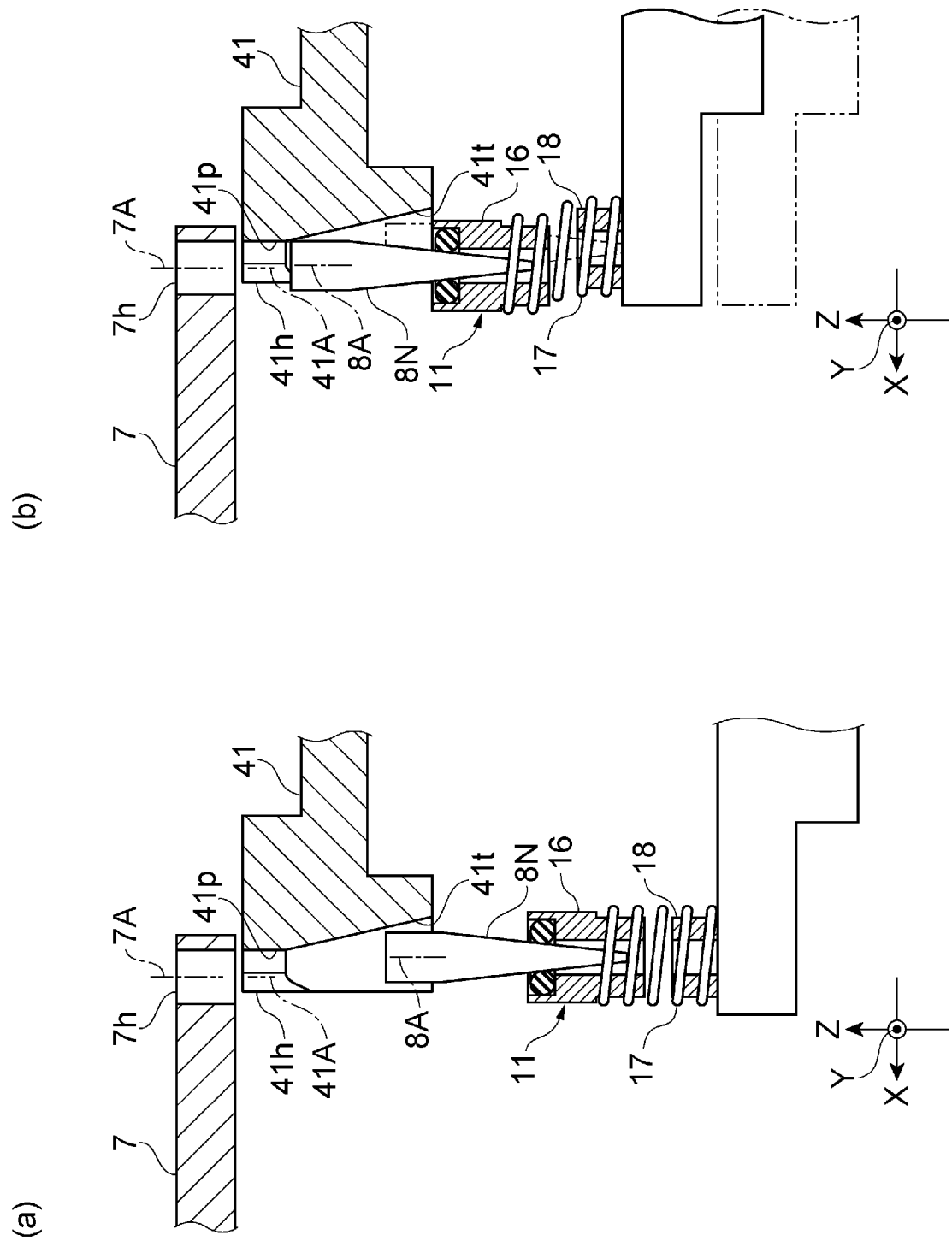
FIG. 17 is a diagram showing a guide function of a capillary fulfilled by the capillary holding portion and the capillary guide device.
Figure 18:
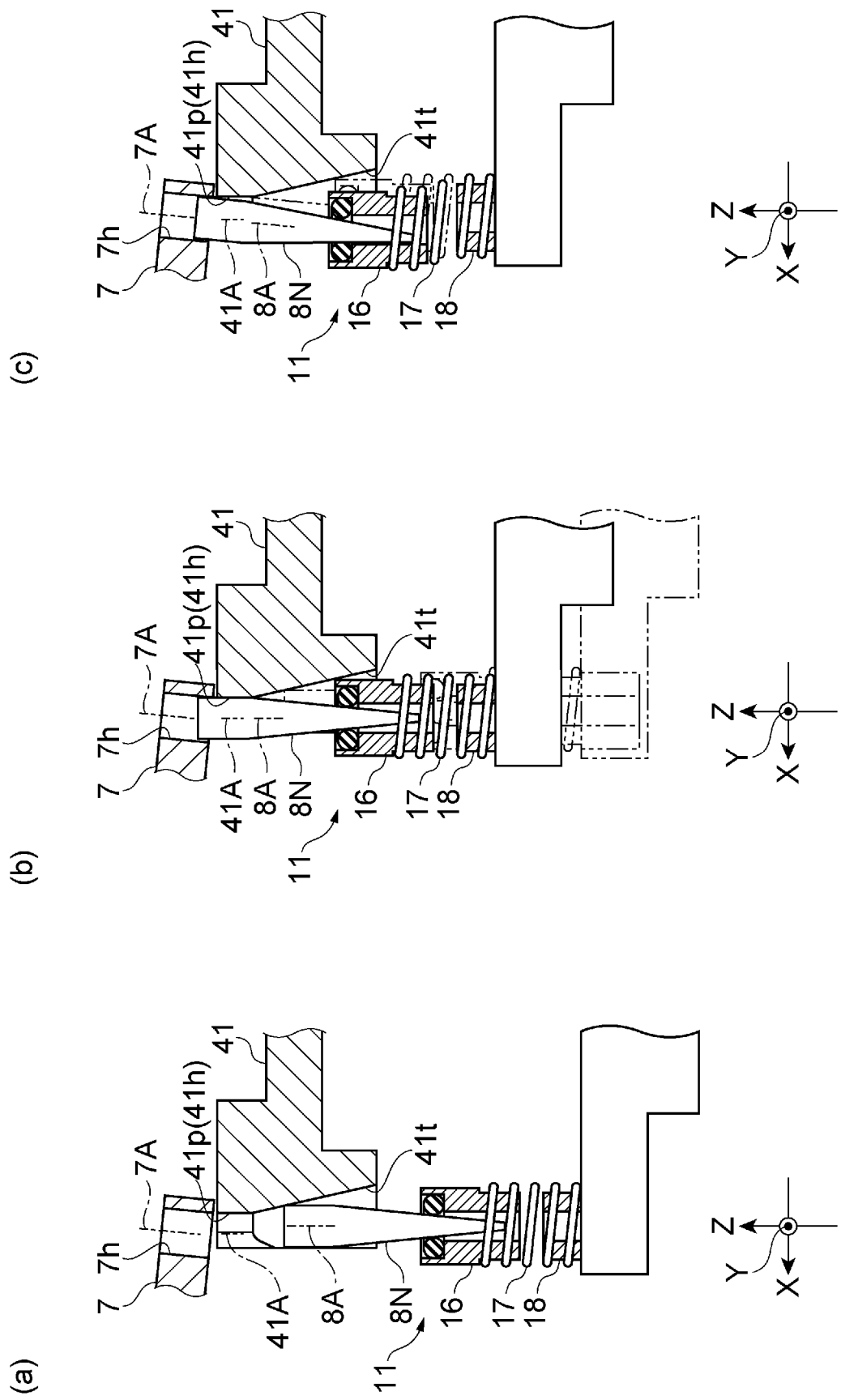
FIG. 18 is a diagram showing another guide function of the capillary fulfilled by the capillary holding portion and the capillary guide device.

From the state shown in Part (a) of FIG. 17, the capillary holding portion 11 is moved in the Z-axis direction. Then, as shown in Part (b) of FIG. 17, first, an upper end of the capillary 8N comes into contact with a wall surface of the tapered hole portion 41t. When the capillary holding portion 11 is further moved upward, the capillary 8N is moved along the wall surface. This movement includes a component in the horizontal direction (the X-axis direction) in addition to an upward component (the Z-axis direction). In the capillary holding portion 11, the upper socket 16 may be moved with respect to the lower socket 18 by the coil spring 17. That is, when the lower socket 18 is moved upward, the upper socket 16 is moved upward and is also moved horizontally by the coil spring 17.

According to this movement, the axis 8A of the capillary 8N gradually approaches the axis 7A of the hole 7h. When the upper end of the capillary 8N reaches the parallel hole portion 41p, the axis 8A of the capillary 8N overlaps the axis 7A of the hole 7h. Thus, the capillary 8N is inserted into the hole 7h of the ultrasonic horn 7.

In the example shown in Part (a) of FIG. 17, the positional relationship between the ultrasonic horn 7 and the guide body portion 41 is ideal. On the other hand, in an example shown in Part (a) of FIG. 18, the axis 7A of the hole 7h of the ultrasonic horn 7 is inclined with respect to the axis 41A of the guide body portion 41.

An operation of inserting the capillary 8N in this state is described. As shown in Part (b) of FIG. 18, the axis 8A of the capillary 8N is relatively inclined with respect to the axis 7A of the hole 7h. Thus, because the upper end of the capillary 8N is in contact with a wall surface of the hole 7h, the capillary 8N may not be inserted any further into the hole 7h. In order to insert the capillary 8N further into the hole 7h, it is necessary to make the axis 8A of the capillary 8N parallel to the axis 7A of the hole 7h and to overlap the axis 8A with the axis 7A.

As described above, in the capillary holding portion 11, the upper socket 16 may be deviated from the lower socket 18, and the capillary 8N may be inclined with respect to the axis 16A of the upper socket 16. According to these actions, as shown in Part (c) of FIG. 18, as the capillary holding portion 11 is raised, the axis 8A of the capillary 8N gradually approaches the axis 7A of the hole 7h, and finally may be inserted into the hole 7h. That is, because the capillary holding portion 11 flexibly holds the capillary 8N, the deviation between the capillary 8N and the guide body portion 41 and the deviation between the capillary 8N and the hole 7h of the ultrasonic horn 7 can be eliminated. Thus, according to the capillary holding portion 11 and the guide body portion 41, the capillary 8N can be reliably mounted.

Next, as shown in Part (a) of FIG. 19, the ultrasonic horn 7 is separated from the guide body portion 41. Specifically, the control device 27 supplies a control signal to the bonding portion 3. As a result, the ultrasonic horn 7 is moved upward (in a positive Z-axis direction).

As shown in Part (b) of FIG. 19, the guide body portion 41 is separated from the capillary 8N. Specifically, first, the control device 27 supplies a signal E15 to the ultrasonic element 47a. The signal E15 is a signal for moving the table 46 in the negative X-axis direction. The control device 27 generates the signal E15 that repeats a signal component having positive amplitude and a relatively high frequency and a signal component having negative amplitude and a relatively low frequency. As a result, the table 46 is moved in the negative X-axis direction. Then, when the guide body portion 41 returns to an initial position, the control device 27 stops supplying the control signal.

Operational effects of the capillary guiding device 40 and the wire bonding apparatus 1 according to the embodiment are described below.

The capillary guide device 40 guides the capillary 8 into the hole 7h of the bonding tool 6. The capillary guide device 40 includes the guide body portion 41 which is capable of being in contact with the capillary 8 held in the hole 7h, and the drive portion 42 for arranging the guide body portion 41 at a position capable of being in contact with the capillary 8 by moving the guide body portion 41 along the X-axis direction along a central axis of the hole 7h. The drive portion 42 includes the table 46 connected to the guide body portion 41, the drive shaft 47b extending in the X-axis direction and exerting a frictional resistance force with the table 46, and the ultrasonic element 47a fixed to the end of the drive shaft 47b and supplying an ultrasonic wave to the drive shaft 47b.

The guide body portion 41 may be in contact with the capillary 8 held by the bonding tool 6. With this contact, the position of the capillary 8 held by the bonding tool 6 may be preserved as the position of the guide body portion 41. When the guide body portion 41 is brought into contact with the capillary 8, the drive portion 42 moves the table 46 by the ultrasonic wave supplied by the ultrasonic element 47a, thereby bringing the guide body portion 41 closer the capillary 8. The position of the guide body portion 41 in contact with the capillary 8 is held by the frictional resistance force between the table 46 and the drive shaft 47b. In the state where the guide body portion 41 is in contact with the capillary 8, there is no force with which the guide body portion 41 presses the capillary 8. As a result, a relative position of the guide body portion 41 with respect to the bonding tool 6 is reliably maintained when the capillary 8 is detached. When the capillary 8 is guided by the guide body portion 41, the capillary 8 can be reliably guided to the hole 7h of the bonding tool 6. Thus, the automatic replacement work of the capillary 8 can be reliably performed.

In short, the guide body portion 41 is brought into contact with the capillary 8 and positioned using the already inserted capillary 8 as a reference component. For example, a mechanism for bringing the guide body portion into contact with the capillary includes a mechanism using a lead screw. However, mechanical strain may be accumulated due to rattling (backlash) between the lead screw and a nut. In addition, when the guide body portion is pressed against the capillary, the pressing force may cause the entire unit to bend. For example, when the guide body portion is pressed against the capillary by using an air cylinder, the extra stroke and the like are released when the capillary is detached. As a result, the position of the guide body portion may be deviated.

With respect to the aforementioned problems, the drive section 42 using an ultrasonic motor as a drive source has no mechanical rattling. In addition, the capillary guide device 40 holds the position of the guide body portion 41 by the frictional resistance force between the table 46 and the drive shaft 47b. That is, no mechanical strain is accumulated in the capillary guide device 40. Thus, even if the capillary 8 is detached, the position of the guide body portion 41 is reliably maintained. As a result, a following effect exerted by the capillary guide device 40 can be maximized. In addition, tuning work for adapting each individual characteristic can be eliminated for each wire bonding apparatus 1.

The drive portion 42 of the capillary guide device 40 further has the ultrasonic element 48 which is attached to the table 46 and which supplies vibration along the Y-axis direction to the guide body portion 41 via the table 46. According to this configuration, the guide body portion 41 can be reliably brought into contact with the capillary 8. Thus, the position of the capillary 8 can be further satisfactorily preserved as the position of the guide body portion 41.

The guide body portion 41 of the capillary guide device 40 includes the parallel hole portion 41p capable of being in contact with the side surface of the capillary 8 and the tapered hole portion 41t continuous with the parallel hole portion 41p. The main surface 41a of the guide body portion 41 facing the bonding tool 6 includes an open end forming the parallel hole portion 41p. The back surface 41b of the guide body portion 41 opposite to the main surface 41a includes an open end forming the tapered hole portion 41t. According to this configuration, the new capillary 8 is supplied from the tapered hole portion 41t side. As a result, even when the outer peripheral surface of the capillary body 8b is deviated from the parallel hole portion 41p, the capillary 8 is moved along the tapered hole portion 41t continuous with the parallel hole portion 41p, and thereby, the capillary 8 is guided to the parallel hole portion 41p. Thus, the automatic replacement work of the capillary 8 can be performed more reliably.

The capillary guide device 40 further includes the contact detection portion 43 which detects that the guide body portion 41 comes into contact with the bonding tool 6. The contact detector 43 further has the power source 51 which causes the potential difference between the bonding tool 6 and the guide body portion 41, and the ammeter 52 which obtains information indicating that the guide body portion 41 comes into contact with the bonding tool 6 according to the state of the electric circuit formed by the bonding tool 6, the guide body portion 41, and the power source 51. According to this configuration, the contact between the bonding tool 6 and the guide body portion 41 can be electrically detected. Thus, the reaction force acting between the bonding tool 6 and the guide body portion 41 can be made extremely small. Then, the relative position of the guide body portion 41 with respect to the bonding tool 6 can be maintained more reliably.

The wire bonding apparatus 1 includes the bonding tool 6 having the capillary 8 detachably held in the hole 7h and the capillary replacement device 9 which guides the capillary 8 toward the hole 7h by the capillary guiding device 40 and attaches the capillary 8 to the hole 7h. The capillary guide device 40 has the guide body portion 41 capable of being in contact with the capillary 8 held in the hole 7h, and the drive portion 42 that arranges the guide body portion 41 at the position capable of being in contact with the capillary 8 by moving the guide body portion 41 along the X-axis direction along the central axis of the hole 7h. The drive portion 42 includes the table 46 connected to the guide body portion 41, the drive shaft 47b extending in the X-axis direction and exerting a frictional resistance force with the table 46, and the ultrasonic element 47a fixed to the end of the drive shaft 47b and supplying an ultrasonic wave to the drive shaft 47b. The wire bonding apparatus 1 includes the capillary guide device 40. Thus, the wire bonding apparatus 1 can reliably perform the automatic replacement work of the capillary 8.

Although the embodiment of the present invention has been described above, the present invention is not limited to the above embodiment and may be implemented in various embodiments.

Modification Example 1

In the capillary replacement device 9 of the embodiment, the ultrasonic drive motor based on impact drive using the law of inertia is illustrated as the drive source. The drive source of the capillary replacement device 9 is not limited to this configuration, and a device capable of generating a force along a predetermined direction may be appropriately employed. For example, a linear guide using a ball screw may be employed as the drive source.

Modification Example 2

Figure 20:
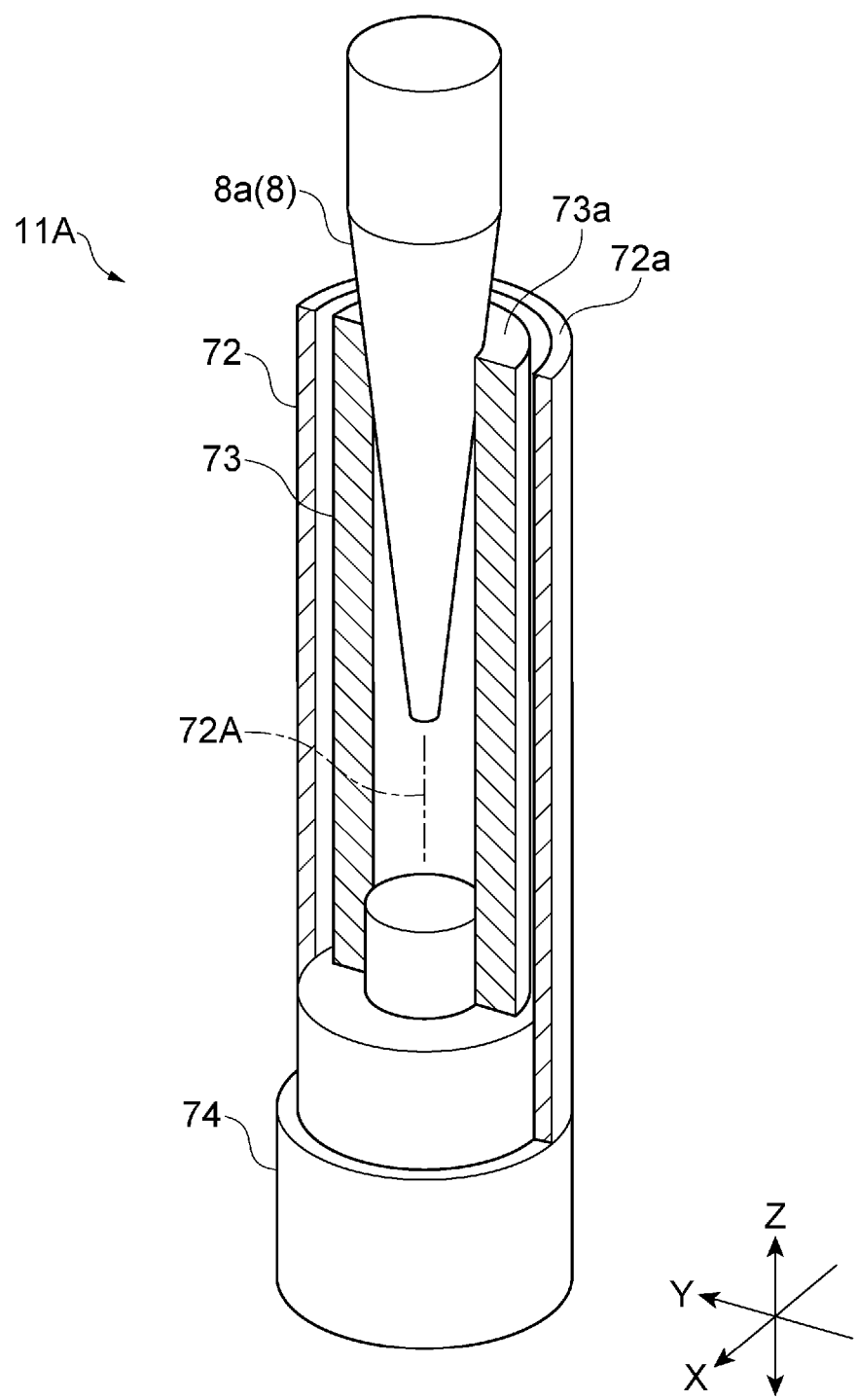
FIG. 20 is a perspective view showing a cross section of a capillary holding portion according to a modification example.

The capillary holding portion may hold the capillary 8 in a mode where the posture of the capillary 8 may be changed flexibly. Thus, the present invention is not limited to the configuration of the capillary holding portion, and a capillary holding portion 11A according to a modification example shown in FIG. 20 may be employed.

The capillary holding portion 11A has, as main constituent elements, a pipe 72 made of metal, a tube 73 made of silicone resin, and a cap 74. The pipe 72 has a tubular shape and accommodates the tube 73 therein. One end of the pipe 72 and one end of the tube 73 are closed by the cap 74. The cap 74 is held by the holder 14. An upper end 73a (upper end opening edge) of the tube 73 substantially matches an upper end 72a of the pipe 72. In addition, an outer diameter of the tube 73 is smaller than an inner diameter of the pipe 72. That is, a slight gap is formed between an outer peripheral surface of the tube 73 and an inner peripheral surface of the pipe 72. Besides, a tapered surface 8a of the capillary 8 is held at the upper end 73a of the tube 73.

According to the capillary holding portion 11A, the tube 73 has a predetermined flexibility. Thus, the capillary holding portion 11A can allow the posture change of the capillary 8 by the amount of the gap formed between the outer peripheral surface of the tube 73 and the inner peripheral surface of the pipe 72. Specifically, eccentricity and inclination of the pipe 72 to a direction intersecting an axis 72A can be allowed.

Here, in the case of only the tube 73, rigidity of the tube 73 may be insufficient depending on the posture of the capillary 8, and thus the capillary 8 may not be held. However, because the pipe 72 having rigidity higher than that of the tube 73 exists outside the tube 73, even when the rigidity of the tube 73 is insufficient, displacement of the capillary 8 can be kept within the allowable range by the pipe 72.

When the capillary 8 is inserted into the tube 73, a contact state between an inner peripheral edge of the upper end 73a and the tapered surface 8a is a line contact. Thus, similarly to the capillary holding portion 11A according to the embodiment, the capillary 8 can also be inclined and held.

REFERENCE SIGNS LIST 1 wire bonding apparatus
2 base
3 bonding portion
4 transfer portion
6 bonding tool
7 ultrasonic horn
7h hole (holding hole)
8, 8N, 8U capillary
8a tapered surface
9 capillary replacement device
10 capillary transfer device
11, 11A capillary holding portion
12 actuator
14 holder
15 flexible portion
16 upper socket
16c counter-bore portion
16e small-diameter portion
16h through hole
17 coil spring
18 lower socket
18e small-diameter portion
18f large-diameter portion
19 O-ring
21 actuator base
22A, 22B linear motor
24 linear guide
24a table
26 carriage
27 control device
28A, 28B drive shaft
29A, 29B ultrasonic element
31, 32 guide
33 front disc
34 pressurizing disc
36 rear disc
37, 38 shaft body
40 capillary guide device (guide portion)
41 guide body portion
41h guide hole
41p parallel hole portion (guide surface)
41t tapered hole portion (tapered surface)
42 drive portion
43 contact detection portion
44 drive body portion
46 table (moving body)
47A, 47B linear motor
47a ultrasonic element (ultrasonic wave generation body)
47b drive shaft
48 ultrasonic element (vibration generation portion)
49 connection portion
51 power source (voltage supply portion)
52 ammeter (information acquisition portion)
54 capillary stocker
55 capillary recovery portion
61 attachment/detachment jig
62 jig drive portion
72 pipe
73 tube
74 cap

What is claimed is:

1. A capillary guide device, adapted to guide a capillary into a holding hole of a bonding tool, comprising:
a guide body portion, capable of being in contact with the capillary held in the holding hole; and
a drive portion, arranging the guide body portion at a position capable of being in contact with the capillary by moving the guide body portion along a second direction, wherein the second direction is a direction intersecting a first direction along a central axis of the holding hole, wherein the drive portion comprises:

a moving body, connected to the guide body portion;

a drive shaft, extending in the second direction and exerting a frictional resistance force with the moving body; and an ultrasonic wave generation body, fixed to an end of the drive shaft and supplying an ultrasonic wave to the drive shaft.

2. The capillary guide device according to claim 1, wherein the drive portion further comprises a vibration generation portion which is attached to the moving body and which supplies a vibration along a third direction intersecting each of the first direction and the second direction to the guide body portion via the moving body.

3. The capillary guide device according to claim 1, wherein the guide body portion comprises: a guide surface capable of being in contact with a side surface of the capillary, and a tapered surface continuous with the guide surface, a main surface of the guide body portion facing the bonding tool comprises an open end that constitutes the guide surface, and a back surface of the guide body portion opposite to the main surface comprises an open end that constitutes the tapered surface.

4. The capillary guide device according to claim 1, further comprising a contact detection portion which detects that the guide body portion comes into contact with the bonding tool, wherein the contact detection portion further comprises:

a voltage supply portion which generates a potential difference between the bonding tool and the guide body portion; and an information acquisition portion which acquires an information indicating that the guide body portion comes into contact with the bonding tool according to a state of an electric circuit formed by the bonding tool, the guide body portion, and the voltage supply portion.

5. A wire bonding apparatus, comprising:

a bonding tool, comprising a capillary detachably held in a holding hole; and a mounting portion, guiding the capillary to the holding hole by a guide portion and attaching the capillary to the holding hole, wherein the guide portion comprises:

a guide body portion, capable of being in contact with the capillary held in the holding hole; and a drive portion, arranging the guide body portion at a position capable of being in contact with the capillary by moving the guide body portion along a second direction, wherein the second direction is a direction intersecting a first direction along a central axis of the holding hole, wherein the drive portion comprises:

a moving body, connected to the guide body portion;

a drive shaft, extending in the second direction and exerting a frictional resistance force with the moving body; and an ultrasonic wave generation body, fixed to an end of the drive shaft and supplying an ultrasonic wave to the drive shaft.

\* \* \* \* \*